(12) United States Patent
Lin et al.

(10) Patent No.: US 8,445,339 B2
(45) Date of Patent: May 21, 2013

(54) CONDUCTOR STRUCTURE, PIXEL STRUCTURE, AND METHODS OF FORMING THE SAME

(75) Inventors: Hantu Lin, Hsinchu (TW); Chienhung Chen, Hsinchu (TW)

(73) Assignee: AU Optronics Corp., Hsinchu (TW)

(*) Notice: Subject to any disclaimer, the term of this patent is extended or adjusted under 35 U.S.C. 154(b) by 0 days.

(21) Appl. No.: 13/309,882

(22) Filed: Dec. 2, 2011

(65) Prior Publication Data

US 2012/0077297 A1   Mar. 29, 2012

Related U.S. Application Data

(63) Continuation of application No. 13/113,122, filed on May 23, 2011, now Pat. No. 8,101,951, which is a continuation of application No. 11/972,086, filed on Jan. 10, 2008, now Pat. No. 7,968,895.

(30) Foreign Application Priority Data

May 30, 2007   (TW) .............................. 96119290 A

(51) Int. Cl.
   *H01L 21/84*   (2006.01)

(52) U.S. Cl.
   USPC ............. 438/159; 438/30; 438/149; 438/158; 438/160; 438/164; 257/401; 257/E21.094; 257/E21.104; 257/E21.414; 257/E29.291; 257/E29.294; 257/E33.065; 257/E21.621; 257/E21.635; 349/42; 349/43; 349/46; 349/38; 349/39; 349/139

(58) Field of Classification Search
   USPC .... 438/30, 149, 158, 159, 160, 164; 257/401, 257/618, 632, 649, E21.094, E21.104, E21.411, 257/E21.414, E21.621, E21.635, E29.291, 257/E29.294, E33.065; 349/42, 43, 46, 38, 349/39, 139
   See application file for complete search history.

(56) References Cited

U.S. PATENT DOCUMENTS

| 3,849,136 A | 11/1974 | Grebe |
| 4,640,738 A | 2/1987 | Fredericks et al. |
| 5,275,695 A | 1/1994 | Chang et al. |

(Continued)

FOREIGN PATENT DOCUMENTS

| JP | 53104185 | 9/1978 |
| JP | 11-261099 A | 9/1999 |

(Continued)

OTHER PUBLICATIONS

English translation of abstract of JP 53104185.

(Continued)

*Primary Examiner* — Kimberly Rizkallah
*Assistant Examiner* — Maria Ligai
(74) *Attorney, Agent, or Firm* — McClure, Qualey & Rodack, LLP

(57) ABSTRACT

A method for forming a conductor structure is provided. The method comprises: (1) providing a substrate; (2) forming a patterned dielectric layer with a first opening which exposes a portion of the substrate; forming a patterned organic material layer on the dielectric layer with a second opening which corresponds to the first opening and expose the exposed portion of the substrate; (3) forming a first barrier layer on the organic material layer and the exposed portion of the substrate; (4) forming a metal layer on the first barrier layer; and (5) removing the organic material layer, the first barrier layer thereon and the metal layer thereon.

34 Claims, 18 Drawing Sheets

U.S. PATENT DOCUMENTS

| | | |
|---|---|---|
| 5,300,813 A | 4/1994 | Joshi et al. |
| 5,766,446 A | 6/1998 | Spindt et al. |
| 5,930,610 A | 7/1999 | Lee |
| 6,335,569 B1 | 1/2002 | Joshi |
| 6,500,566 B1 | 12/2002 | Smith |
| 7,109,119 B2 | 9/2006 | Bao et al. |
| 7,221,012 B2 | 5/2007 | Chu et al. |
| 7,772,778 B2 | 8/2010 | Satoh et al. |
| 7,968,895 B2 | 6/2011 | Lin et al. |
| 2002/0006336 A1 | 1/2002 | Kato et al. |
| 2005/0179040 A1 | 8/2005 | Tanaka |
| 2006/0223329 A1 | 10/2006 | Martin et al. |
| 2006/0284254 A1 | 12/2006 | Liu et al. |
| 2007/0069200 A1 | 3/2007 | Lumbard |
| 2008/0239680 A1 | 10/2008 | Yasuda |
| 2008/0296591 A1 | 12/2008 | Lin et al. |
| 2009/0115066 A1 | 5/2009 | Yang et al. |
| 2011/0220923 A1 | 9/2011 | Lin et al. |

FOREIGN PATENT DOCUMENTS

| | | |
|---|---|---|
| JP | 2002-170881 A | 6/2002 |
| JP | 2006-278155 A | 10/2006 |
| TW | 436995 | 5/2001 |
| TW | 200539264 A | 12/2005 |
| TW | I271867 | 1/2007 |
| TW | I281586 | 5/2007 |

OTHER PUBLICATIONS

Taiwan Notice of Allowance mailed Jan. 28, 2011.
English translation of abstract of TW 436995.
English translation of abstract of TW 200539264 A.
English translation of abstract of JP 2006-278155 A.
English translation of abstract of JP 11-261099A.

CONDUCTOR STRUCTURE, PIXEL STRUCTURE, AND METHODS OF FORMING THE SAME

The present application is a continuation application of U.S. patent application Ser. No. 13/113,122 filed on May 23, 2011, now allowed, which is a continuation application of U.S. patent application Ser. No. 11/972,086 filed on Jan. 10, 2008 and issued on Jun. 28, 2011 as U.S. Pat. No. 7,968,895, which claimed the benefit from the priority of Taiwan Patent Application No. 096119290 filed on May 30, 2007, the disclosures of which is incorporated by reference herein in its entirety.

BACKGROUND OF THE INVENTION

1. Field of the Invention

The present invention relates to a conductor structure and a method of forming the same. More particularly, the present invention relates to a conductor structure for a display or an electro-optical device and a method of forming the same.

2. Descriptions of the Related Art

With evolving manufacturing technologies, the liquid crystal display (LCD) has demonstrated its advantage over other displays in terms of image compactness, power consumption and service life. As a result, LCDs have been replacing conventional image tube displays. However, with the increase in the size and resolution of the thin film transistor-LCD (TFT-LCD) panels, the RC delay of signal transmissions within metal conductors has increased. In this case, reducing the RC delay has become difficult.

Since the speed of a signal transmission within a conductor is determined by the product of the resistance (R) and the capacitance (C) of the conductor, the common solution to reduce the RC delay is using a metal with a low resistivity, such as Al or even Cu. For example, Al conductors have a resistivity of about 5 $\mu\Omega/cm$, while that of copper conductors may have a resistivity as low as 2.2 $\mu\Omega/cm$. Hence, if copper conductors are adopted, the resistance value thereof will be decreased significantly, thus eliminating the image delay even for an increased panel size. Furthermore, the cost of the material will become less expensive than those adopted in the current mass production technology.

A conventional process for manufacturing copper conductors is described briefly: a barrier layer 11 and a copper layer 13 is first formed on a glass substrate 10, as shown in FIG. 1A. Then a photoresist layer 15 is formed on the glass substrate 10 and is patterned, as shown in FIG. 1B. Subsequently, an etching process is performed to remove portions of the barrier layer 11 and the copper layer 13 are not covered by the photoresist layer, as shown in FIG. 1C. Finally, the photoresist layer 15 is removed to complete the copper conductor manufacturing process, as shown in FIG. 1D. However, in the conventional process for manufacturing copper conductors in an LCD, a number of difficulties have been encountered. For example, it is difficult to etch copper into a predetermined structure. When a copper conductor is manufactured, it is impossible to etch the metal with the same etchant solution used in conventional manufacturing processes (e.g. an Al etchant solution). As a result, new etchant solutions have to be developed, which is very time consuming and labor intensive. Furthermore, the etchant solutions used for copper have a short life-time, leave residuals in the copper/barrier layer and render the taper structure is not good. In addition, the copper element used for forming the conductor structure is prone to diffuse into both the dielectric layer and the semiconductor layer, which may cause a short circuit or electron migration, thus adversely affecting the production yield significantly.

It can be seen from the above description that it is difficult to pattern the copper layer during the conventional manufacturing process. In view of this, it is important to provide a method for forming a copper conductor structure that can overcome these difficulties.

SUMMARY OF THE INVENTION

The primary objective of this invention is to provide a method for forming a conductor structure, which comprises: providing a substrate; forming a patterned dielectric layer on the substrate, which the dielectric layer has a first opening exposing a portion of the substrate; forming a patterned organic material layer on the patterned dielectric layer, which the patterned organic material layer has a second opening corresponding to a portion of the first opening and exposing the portion of the substrate exposed through the first opening; forming a first barrier layer on a portion of the exposed portion of the substrate and on the patterned organic material layer; forming a metal layer on the first barrier layer; and removing the patterned organic material layer, as well as the first barrier layer and the metal layer thereon.

Another objective of this invention is to provide a method for forming a conductor structure, which comprises: providing a substrate; forming a dielectric layer on the substrate; forming a patterned organic material layer on the dielectric layer, which the patterned organic material layer has a first opening with a first width and the first opening exposes a portion of the dielectric layer; removing a portion of the dielectric layer under the first opening to form a second opening corresponding to the first opening for exposing a portion of the substrate, wherein the second opening has one end with a second width that is proximal to the substrate, and the other end with a third width that is distal to the substrate; forming a first barrier layer on the substrate within the second opening and on the patterned organic material layer; and forming a metal layer on the first barrier layer within the second opening and on the patterned organic material layer; wherein the first width is substantially smaller than at least one of the second width and the third width, while the second width is substantially smaller than the third width.

Another objective of this invention is to provide a method for forming a conductor structure, which comprises: providing a substrate; forming a patterned organic material layer on the substrate, wherein the patterned organic material layer has a first opening that exposes a portion of the substrate; forming a first barrier layer on a portion of the exposed portion of the substrate and on the patterned organic material layer; forming a metal layer on the first barrier layer; and removing the patterned organic material layer, as well as the first barrier layer and the metal layer on the patterned organic material layer.

Another objective of this invention is to provide a pixel structure, which comprises: a substrate with at least one thin film transistor region, scanning line region; data line region, and pixel region; a capacitance region; a patterned dielectric layer formed on the substrate, which has a plurality of openings is adapted to individually expose a portion of the substrate in the thin film transistor region, the scanning line region, and the capacitance region; a first patterned conductor structure formed above the exposed substrate within the openings in the thin film transistor region, the scanning line region, and the capacitance region; an insulating layer formed above the substrate; an active layer formed on the insulating layer in the thin film transistor region; a second patterned conductor structure formed on the two ends of the active layer and on the insulating layer in the data line region; and a patterned protective layer formed above the substrate.

Another objective of this invention is to provide a pixel structure, which comprises: a substrate with at least one thin film transistor region, scanning line region, data line region, and pixel region; a capacitance region; an active layer, wherein a portion thereof is formed on the substrate in the thin film transistor region; an insulating layer formed on the substrate; a first patterned dielectric layer formed above the substrate with a plurality of first openings being adapted to individually expose portions of the insulating layer in the thin film transistor region, the scanning line region, and the capacitance region; a first patterned conductor structure formed on the exposed insulating layer in the thin film transistor region, the scanning line region, and the capacitance region; a second patterned dielectric layer formed above the substrate; a second patterned conductor structure formed on the second patterned dielectric layer in the data line region, on the second patterned dielectric layer in a portion of the thin film transistor region, and on the second patterned dielectric layer connected to the active layer and the capacitance region; a patterned protective layer formed above the substrate; and a patterned pixel electrode formed on the patterned protective layer in the pixel region connected to the second patterned conductor structure in the thin film transistor region.

Another objective of this invention is to provide a pixel structure, which comprises: a substrate with at least one thin film transistor region, scanning line region, data line region, and pixel region; a first patterned dielectric layer formed on the substrate and defining a plurality of first openings being adapted to individually expose portions of the substrate in the thin film transistor region and the data line region; a first patterned conductor structure formed on the exposed substrate in the thin film transistor region and the data line region; an active layer, wherein a portion of the active layer is formed on the substrate in the thin film transistor region and a portion of the active layer is formed on the substrate in the data line region; a second patterned dielectric layer formed above the substrate; a second patterned conductor structure formed on the second patterned dielectric layer in the thin film transistor region and on the second patterned dielectric layer in a portion of the data line region; a patterned protective layer formed above the substrate; and a patterned pixel electrode formed on the patterned protective layer in the pixel region and on a portion of the patterned protective layer in the data line region, wherein the patterned pixel electrode is connected to the second patterned conductor structure in the thin film transistor region.

Another objective of this invention is to provide a method for forming a pixel structure which comprises: providing a substrate; forming a patterned dielectric layer on the substrate, which is defined at least one thin film transistor region, scanning line region, data line region, pixel region, and a capacitance region, wherein the patterned dielectric layer has a plurality of openings is adapted to individually expose portions of the substrate in the thin film transistor region, in the scanning line region, and in the capacitance region; forming a first patterned conductor structure on the exposed substrate in the thin film transistor region, the scanning line region, and the capacitance region; forming an insulating layer above the substrate; forming an active layer on the insulating layer in the thin film transistor region; forming a second patterned conductor structure on the two ends of the active layer and on the insulating layer in the data line region; and forming a patterned protective layer above the substrate.

Another objective of this invention is to provide a method for forming a pixel structure, which comprising: providing a substrate with at least one thin film transistor region, scanning line region, data line region, pixel region, and capacitance region; forming an active layer, wherein a portion of the active layer is formed on the substrate in the thin film transistor region; forming an insulating layer on the substrate; forming a first patterned dielectric layer above the substrate, which defines a plurality of openings is adapted to individually expose the insulating layer in portions of the thin film transistor region, the scanning line region and the capacitance region; forming a first patterned conductor structure on the exposed insulating layer in the thin film transistor region, the scanning line region, and the capacitance region; forming a second patterned dielectric layer above the substrate; forming a second patterned conductor structure on the second patterned dielectric layer in the data line region, on the second patterned dielectric layer in a portion of the thin film transistor region connected to the active layer, and on the second patterned dielectric layer in the capacitance region; forming a patterned protective layer above the substrate; and forming a patterned pixel electrode on the patterned protective layer in the pixel region, wherein the patterned pixel electrode is connected to the second patterned conductor structure in the thin film transistor region.

Another objective of this invention is to provide a method for forming a pixel structure, which comprises: providing a substrate with at least one thin film transistor region, data line region and a pixel region; forming a first patterned dielectric layer on the substrate, which defines a plurality of first openings is adapted to individually expose portions of the thin film transistor region and the data line region; forming a first patterned conductor structure on the exposed substrate in the thin film transistor region, and on the exposed substrate in the data line region; forming an active layer, wherein portions of the active layer are formed above the substrate in the thin film transistor region and in the data line region; forming a second patterned dielectric layer above the substrate; forming a second patterned conductor structure on the second patterned dielectric layer in the thin film transistor region and in a portion of the data line region; forming a patterned protective layer above the substrate; and forming a patterned pixel electrode on the patterned protective layer in the pixel region, wherein the patterned pixel electrode is connected to the first patterned conductor structure in the thin film transistor region and extended to a portion of the patterned protective layer in the data line region.

Another objective of this invention is to provide a display panel comprising any of the pixel structures described above.

Another objective of this invention is to provide an electro-optical device comprising the display panel described above.

Another objective of this invention is to provide a method of forming a display panel, comprising any of the methods of forming a pixel structure described above.

Yet a further objective of this invention is to provide a method for forming an electro-optical device, comprising the method for forming a display panel described above.

The detailed technology and preferred embodiments implemented for the subject invention are described in the following paragraphs accompanying the appended drawings for people skilled in this field to well appreciate the features of the claimed invention.

BRIEF DESCRIPTION OF THE DRAWINGS

FIG. 4H is a top view of the pixel structure formed in FIG. 4G, while FIG. 4F is a cross-sectional view taken along line AA' of FIG. 4H;

FIG. 5E is a top view of the pixel structure formed in FIG. 5D, while FIG. 5D is a cross-sectional view taken along line BB' of FIG. 5E;

FIG. 6C is a top view of the pixel structure formed in FIG. 6B, while FIG. 6B is a cross-sectional view taken along line CC' of FIG. 6C;

FIG. 7E is a top view of the pixel structure formed in FIG. 7D, while FIG. 7D is a cross-sectional view taken along line DD' of FIG. 7E;

FIG. 9E is a top view of the pixel structure formed in FIG. 9D, while FIG. 9D is a cross-sectional view taken along line EE' of FIG. 9E.

DESCRIPTION OF THE PREFERRED EMBODIMENT

Figure 1A:
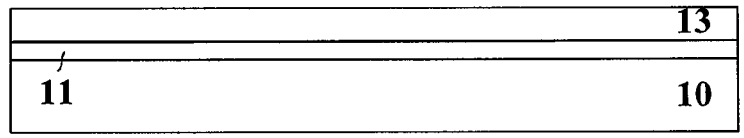
FIGS. 1A to 1D are a schematic views of a method of the prior art for forming a conductor structure.
Figure 1B:
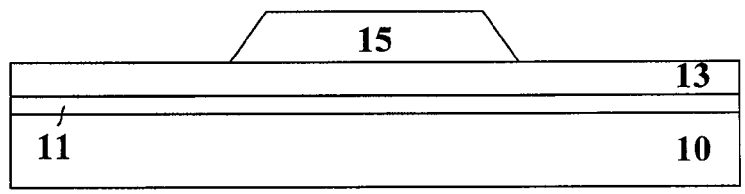
Figure 1C:
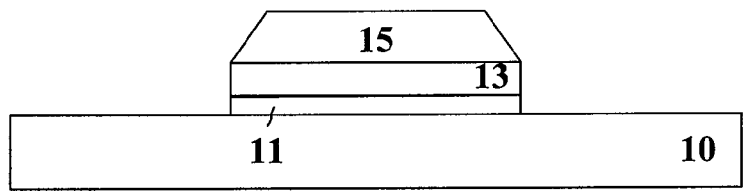
Figure 1D:
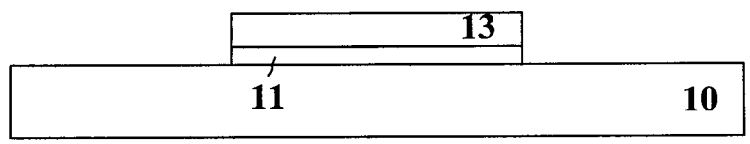
Figure 2A:
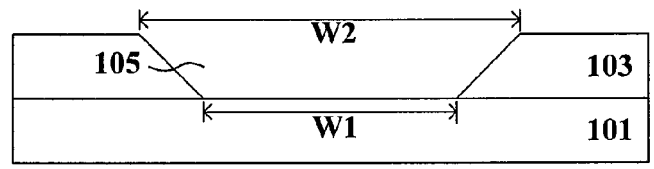
FIGS. 2A to 2E are schematic views of a method for forming a conductor structure in accordance with this invention.

This invention primarily uses the lift-off process to form the conductor structure. The first embodiment of this invention is described in brief as follows. As shown in FIG. 2A, a patterned dielectric layer 103 is formed on the substrate 101. The substrate 101 is generally, made of glass, especially free of alkali metal ions (e.g. $Na^+$, $K^+$) with a low thermal expansion coefficient. However, the substrate can also be made of other materials. Alternatively, the substrate may be optionally made of a transparent material, an opaque material or a flexible material. The transparent material may include, but is not limited to, quartzes, other kinds of glass (such as window glass or other glass), or other transparent materials. The opaque material may include, but is not limited to, ceramics, wafers, or other opaque materials, while the flexible material may include, but is not limited to, polyamides, polyesters, polyolefins, polyalcohols, polymethyl methacrylates (PMMA), polycarbonates (PC), other thermosetting polymers, other thermoplastic polymers, or a combination thereof.

The patterned dielectric layer 103 may be optionally made of an inorganic material, an organic material, or a combination thereof. The inorganic material may include, but is not limited to silicon nitride, silicon oxide, silicon oxynitride, silicon carbide, silicon oxyfluoride, fluorinated silicate glass (FSG), carbon-doped FSG, other inorganic materials, or a combination thereof. The organic material may include, but is not limited to, benzocyclobutene (BCB), parylene-N (PA), fluorinated polyimide (FP), SiOC—H, poly aryl-ethers, hydrogen silsesqioxane (HSQ), methylsilsesquioxane (MSQ), other organic materials, or a combination thereof.

The patterned dielectric layer 103 has a first opening 105 which exposes a portion of the substrate 101. The first opening 105 has a first width W1 at one end proximate to the substrate 101, and a second width W2 at the end distal from the substrate 101. The second width W2 is substantially different from the first width W1, and preferably, for convenience of the subsequent procedures, is substantially greater than the first width W1. The difference between the second width W2 and the first width W1 should be substantially greater than or equal to 1 μm, but is not just limited thereto. To obtain such a preferable structure, for example, the patterned dielectric layer 103 is typically deposited in such a way that the portions of the patterned dielectric layer 103 closer to the substrate 101 have a substantially slower deposition rate than those further from the substrate 101. The deposition manner allows the upper and lower portions of the patterned dielectric layer 103 to be etched at different rates and typically used to a wet etching process. Alternatively, the patterned dielectric layer 103 is typically deposited in such a way that portions of the patterned dielectric layer 103 closer to the substrate 101 have a deposition rate and those further from the substrate 101 have a deposition rate are substantially identical and typically used to the wet etching of the over-etching procedure. However, the upper portion and the lower portion may be made of the same or different materials. Alternatively, depending on requirements of the manufacturing process, other approaches such as a dry etching process or both of the dry etching process and the wet etching process may be used instead to make the second width W2 substantially greater than the first width W1.

Figure 2B:
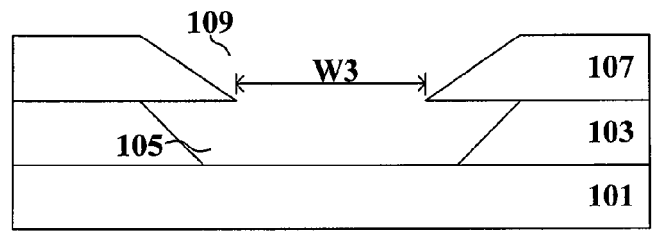

Next, as shown in FIG. 2B, a patterned organic material layer 107 is formed on the patterned dielectric layer 103. The patterned organic material layer 107 is typically made of a material comprising photoresist materials, light sensitive materials, benzocyclobutene (BCB), parylene-N (PA), fluorinated polyimide (FP), SiOC-H, poly aryl-ethers, hydrogen silsesqioxane (HSQ), methylsilsesquioxane (MSQ), other materials, or a combination thereof. In this embodiment, the material is a positive photoresist, although it is not just limited thereto. Alternatively, other photoresist materials may be optionally used, such as a negative photoresist, or other photoresist materials. The positive photoresist used in this embodiment is a light sensitive material typically made of a mixture of a light sensitizer, a resin and a solvent, which will undergo a chain scission under irradiation of a particular light beam and therefore is solvable in a developer solution.

The patterned organic material layer 107 has a second opening 109 defined therein, which corresponds to a portion of the first opening 105 and also exposes a portion of the exposed portion of the substrate 101. At the proximal end of the interface between the organic material layer 107 and the dielectric layer 103, the second opening 109 has a third width W3, which should be substantially smaller than or equal to either the first width W1 or the second width W2. In this embodiment, the third width W3 will be used to define the width of the conductor structure, but is not just limited thereto.

Subsequently, a barrier material, may or may not be used depending on the requirements of the specific design. For example, if copper is used in the following procedures, a barrier layer will have to be formed thereunder. The barrier material may optionally comprise a metal material, such as Mo, Ti, Ta, W, Cr, Al, Cu, other metals, nitrides thereof, oxides thereof, oxynitrides thereof, alloys thereof, Al alloys thereof, Cu alloys thereof, or a combination of the previous metals. Alternatively, the barrier material may optionally comprise a transparent conductive material, such as indium tin oxide (ITO), indium zinc oxide (IZO), aluminum zinc oxide (AZO), and gallium zinc oxide (GZO), cadmium tin oxide (CTO), other materials, or a combination thereof. Still alternatively, other appropriate materials may be optionally selected as a barrier material. For purpose of description, an aspect incorporating the barrier layer will be described in this embodiment.

Figure 2C:
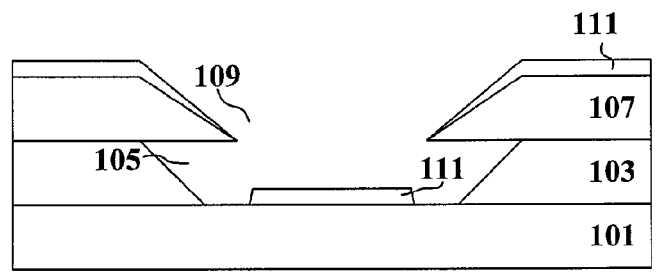
Figure 2D:
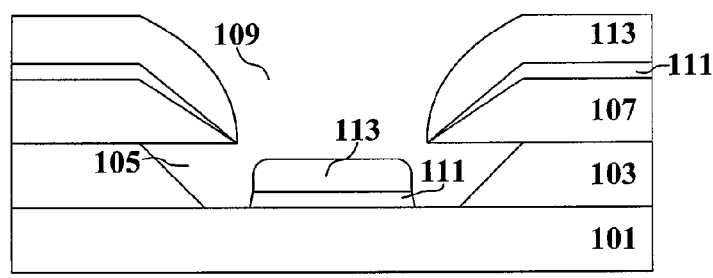

In FIG. 2C, a first barrier layer 111 is formed on the portion of the substrate 101 exposed by the first opening 105 and the second opening 109 and on the patterned organic material layer 107. In FIG. 2D, a metal layer 113 is then formed on the barrier layer 111 in the first opening 105 and the second opening 109 and on the barrier layer 111 above the patterned organic material layer 107. The metal layer 113 may be made of Al, Cu, Ag, Au, Mo, Nd, Al, other materials, alloys thereof, or a combination of the foregoing. Preferably, to prevent the influence related to subsequent manufacturing processes on the metal layer 113, a second barrier layer (not shown) is further formed on the metal layer 113 both in the first opening 105 and above the patterned organic material layer 107.

Figure 2E:
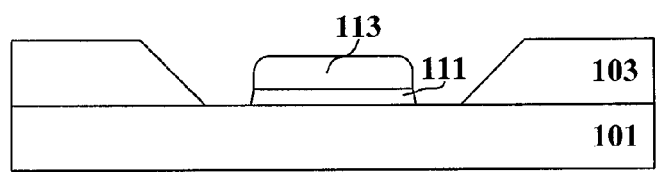

Finally, an appropriate solvent (e.g., a developer solution or other solvents) is used to dissolve and remove the patterned organic material layer 107 via the first opening 105. Since the third width W3 is smaller than the second width W2, the patterned organic material layer 107 is removed at the same time that the solvent flows into the first opening 105 to lift off the patterned organic material layer 107, as well as the first barrier layer 111 and the metal layer 113 formed thereon, as shown in FIG. 2E. The preceding steps result in a metal layer 113 formed on the substrate 101 for use as a conductor structure in the following processes.

Figure 2F:
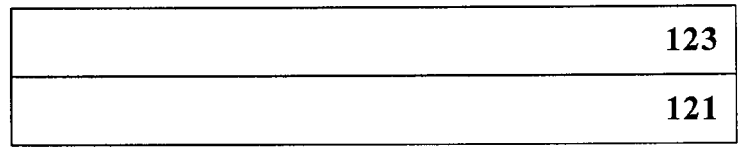
FIGS. 2F to 2H are schematic views of a method for forming a conductor structure in accordance with this invention.
Figure 2G:
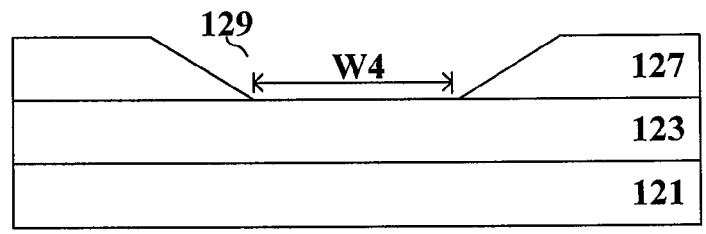
Figure 2H:
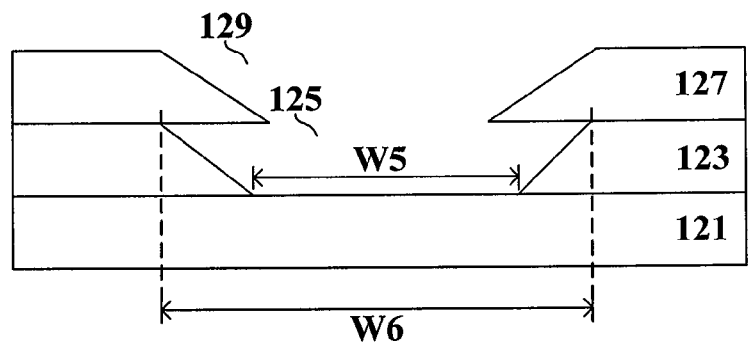

In addition, another method of forming the structure shown in FIG. 2B will be described briefly. Referring to FIG. 2F, a dielectric layer 123 is formed on a substrate 121. Afterwards, as shown in FIG. 2G, a patterned organic material layer 127 with a first opening 129 is formed on the dielectric layer 123. The first opening 129 exposes a portion of the dielectric layer 123 and has a first width W4. Then a portion of the dielectric layer 123 under the first opening 129 is removed to form a second opening 125 corresponding to the first opening 129, thus obtaining a structure as shown in FIG. 2H. The second opening 125 exposes a portion of the substrate 121, and has a second width W5 at one end proximate to the substrate 121 and a third width W6 at the other end distal from the substrate 121. The second width W5 is substantially different from the third width W6. The first width W4 is substantially smaller than or equal to at least one of the second width W5 and the third width W6. Preferably, in removing a portion of the dielectric layer 123 under the first opening 129, an over-etching procedure is performed to make the side walls of the second opening 125 within the dielectric layer 123 taper inwards under the patterned organic material layer 127; that is, the third width W6 is substantially greater than the first width W4. Specifically, the difference between the second width W5 and the third width W6, preferred should be substantially greater than or equal to 1 μm, but is not just limited thereto. To obtain such a preferable structure, for example, the patterned dielectric layer 123 is typically deposited in such a way that portions of the patterned dielectric layer 123 closer to the substrate 121 have a substantially slower deposition rate than those further from the substrate 121, so that the upper portion and the lower portion of the patterned dielectric layer 123 will be etched at different rates and typically used to a wet etching process. Alternatively, the patterned dielectric layer 123 is typically deposited in such a way that portions of the patterned dielectric layer 123 closer to the substrate 121 have a deposition rate and those further from the substrate 121 have a deposition rate are substantially identical and typically used to the wet etching of the over-etching procedure. However, the upper portion and the lower portion may be made of the same or different materials. Alternatively, depending on the requirements of the manufacturing process, other approaches such as a dry etching process or both of the dry etching process and the wet etching process may be used instead to make the third width W6 substantially greater than the second width W5. By comparing FIG. 2H and FIG. 2B, it can be seen that the structure depicted in FIG. 2H is substantially equivalent to that depicted in FIG. 2B, so the subsequent steps following FIG. 2H are just the same as those described in FIGS. 2C to 2E and will not be described again. In addition, as compared to the method shown in FIGS. 2A to 2E which uses two lithographic processing steps, this method utilizes only a single lithographic processing step, which may reduce the manufacturing cost.

The second embodiment of the method for forming a conductor structure will be described briefly. In reference to FIG. 3A, a patterned organic material layer 307 with a first opening 305 defined thereon is formed on the substrate 301. The first opening 305 exposes a portion of the substrate 301, and has a first width W7 at one end proximate to the substrate 301 and a second width W8 at the distal end from the substrate 301. The organic material layer 307 may be made of a material comprising photoresist materials, light sensitive materials, benzocyclobutene (BCB), parylene-N (PA), fluorinated polyimide (FP), SiOC-H, poly aryl-ethers, hydrogen silsesqioxane (HSQ), methylsilsesquioxane (MSQ), other materials, or a combination thereof.

Figure 3A:
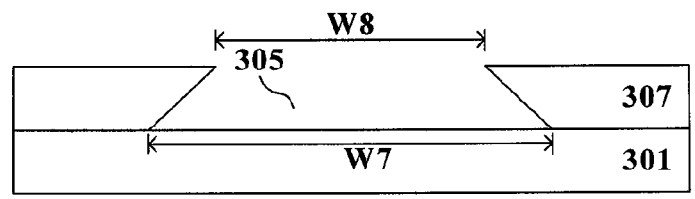
FIGS. 3A to 3D are schematic views of another method for forming a conductor structure in accordance with this invention.

In the second embodiment, the patterned organic material layer 307 is made of a negative photoresist, although it is not just limited thereto. Alternatively, other photoresist materials may be optionally used, such as a positive photoresist, or other photoresist materials. The negative photoresist used in this embodiment tends to have its molecular bonds cross-linked under irradiation of a particular light beam, and therefore is insolvable in a solvent. Generally, for convenience of the following procedures, the second width W8 should be substantially smaller than the first width W7. In other words, the edge of the patterned organic material layer 307 should be shaped into a barb form such as the edge of the patterned organic material layer 307 at the distal end from the substrate 301 has a width is substantially greater than the edge of the patterned organic material layer 307 at one end proximate to the substrate 301 has a width, namely the edge of the patterned organic material layer 307 is upper wider and lower narrow form, as shown in FIG. 3A. The difference between the second width W8 and the first width W7 should also be substantially greater than or equal to 1 μm, but is not just limited thereto. In addition to forming the organic material layer 307 with the negative photoresist in this embodiment, deposition of the patterned organic dielectric layer 307 may also be controlled, so that the upper portion and the lower portion thereof will be etched at different rates. Of course, depending on the requirements of the manufacturing process, other approaches may also be used instead to make the second width W8 substantially smaller than the first width W7.

Subsequently, a barrier layer with a barrier material may or may not be used depending on the requirements of the specific design. For example, if copper is used in the following procedures, a barrier layer will have to be formed thereunder. The barrier material may comprise a metal material, such as Mo, Ti, Ta, W, Cr, Al, Cu, other metals, nitrides thereof, oxides thereof, oxynitrides thereof, alloys thereof, Al alloys thereof, Cu alloys thereof, or a combination of the previous metals. Alternatively, the barrier material may comprise a transparent conductive material, such as indium tin oxide (ITO), indium zinc oxide (IZO), aluminum zinc oxide (AZO), and gallium zinc oxide (GZO), cadmium tin oxide (CTO), other materials, or a combination thereof. Still alternatively, other appropriate materials may be optionally selected as a barrier material. For purpose of description, an aspect incorporating a barrier layer will be described in this embodiment.

Figure 3B:
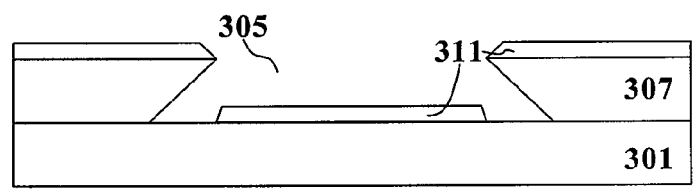
Figure 3C:
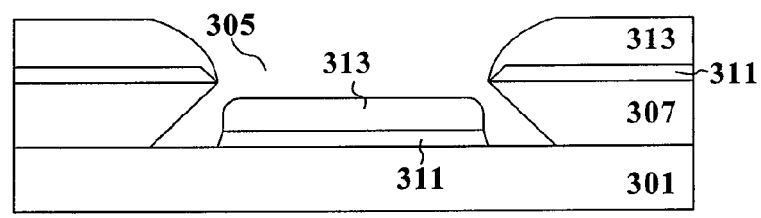

As shown in FIG. 3B, a first barrier layer 311 is formed on the exposed portion of the substrate 301 and the patterned organic material layer 307. Next, as shown in FIG. 3C, a metal layer 313 is then formed on the barrier layer 311 both within the first opening 305 and above the patterned organic material layer 307. The metal layer 113 may be made of any of the materials described in the first embodiment depending on the specific requirements. To prevent influence related to the subsequent manufacturing processes on the metal layer 313, a second barrier layer (not shown) is further formed on the metal layer 313 both within the first opening 305 and above the patterned organic material layer 307.

Figure 3D:
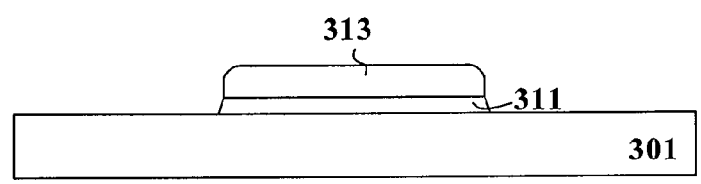

Finally, referring to FIG. 3D, an appropriate solvent (e.g., a developer solution or other solvents) is used to dissolve and remove the patterned organic material layer 307 via the first opening 305. At the same time when the patterned organic material layer 307 is being removed, the first barrier layer 311 and the metal layer 313 on the patterned organic material layer 307 will also be lifted off The preceding steps result in a metal layer 313 formed on the substrate 301 for use as a conductor structure in the following steps.

The above embodiments of this invention may also be applied to form a pixel structure. For example, the third embodiment is also an embodiment for forming a pixel structure in accordance with this invention, and will be described briefly as follows. FIG. 4G is a cross-sectional view taken along line AA' in FIG. 4H. In reference to FIG. 4A, a substrate 401 is defined a thin film transistor (TFT) region 4011, a scanning line region 4013, a data line region 4015, a pixel region 4017, and a capacitance region 4019. For purpose of description, the scanning line region 4013 denoted in FIGS. 4A to 4H is only illustrative of a portion of the scanning line region, while the data line region 4015 is only illustrative of a portion of the data line region. Both the data line region 4015 and the scanning line region 4013 have a contact pad region (not shown) at respective ends, so that other elements (e.g. an external element not shown) may be electrically connected to the data line region 4015 and the scanning line region 4013 via the contact pad regions. Then, a patterned dielectric layer 403 is formed on the substrate 401. The patterned dielectric layer 403 has a plurality of openings 4051, 4053 and 4059 are adapted to respectively expose a portion of the substrate 401 in the TFT region 4011, the scanning line region 4013, and the capacitance region 4019. The patterned dielectric layer 403 may be made of one of the materials described in the first embodiment depending on the specific requirements.

Figure 4A:
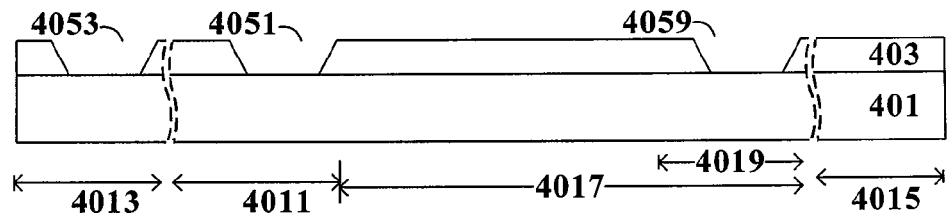
FIGS. 4A to 4G are schematic views of a method for forming a pixel structure in accordance with this invention.
Figure 4B:
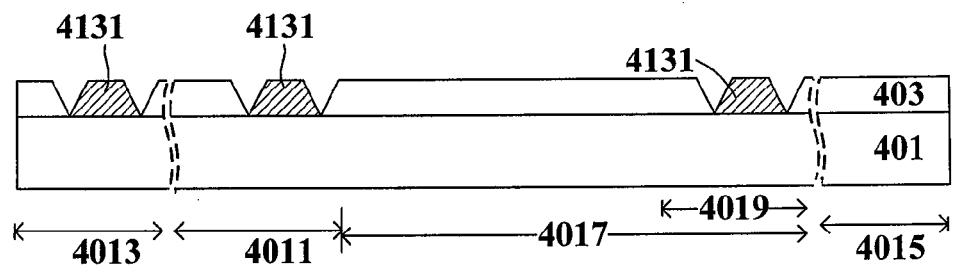

Next, in reference to FIG. 4B, a first patterned conductor structure 4131 is formed above the exposed substrate 401 within the openings in the TFT region 4011, the scanning line region 4013, and the capacitance region 4019. The first patterned conductor structure 4131 may be formed using the methods described in the above embodiments. For example, the method described in the first embodiment is described as follows: a patterned organic material layer (not shown) with a plurality of second openings (not shown) is first formed on the patterned dielectric layer 403, wherein the plurality of second openings correspond to the openings 4051, 4053 and 4059 and expose a portion of the exposed portion of the substrate 401, respectively. Thereafter, a conductor structure (not shown) is formed on the exposed portion of the substrate 401 and the patterned organic material layer. Finally, the patterned organic material layer and the conductor structure thereon are removed, remaining only the conductor structure within the openings 4051, 4053 and 4059 to form the first patterned conductor structure 4131. It should be noted that the preferred embodiment of the method of forming openings to expose a portion of the substrate and forming the conductor structure is either another method of forming the structure shown in FIG. 2B in the first embodiment, or the method of forming the structure of the second embodiment, which means there is no patterned dielectric layer 403, but only the conductor structure, formed on the substrate.

For example, the first patterned conductor structure 4131 comprises a metal layer, the material of which may be determined depending on the specific requirements. Depending on the metal material used in the first patterned conductor structure 4131 or requirements of the design or of the subsequent use, a barrier layer may be formed. For example, if copper is used for the metal layer of the first patterned conductor structure 4131, a barrier layer (e.g. a Mo layer) may have to be formed under the metal layer. The barrier material may be made of one of the materials described in the first embodiment depending on the specific requirements. Furthermore, a second barrier layer may be formed in the first patterned conductor structure 4131 if desired. For purpose of description, a structure without a barrier is depicted in FIG. 4B.

Figure 4C:
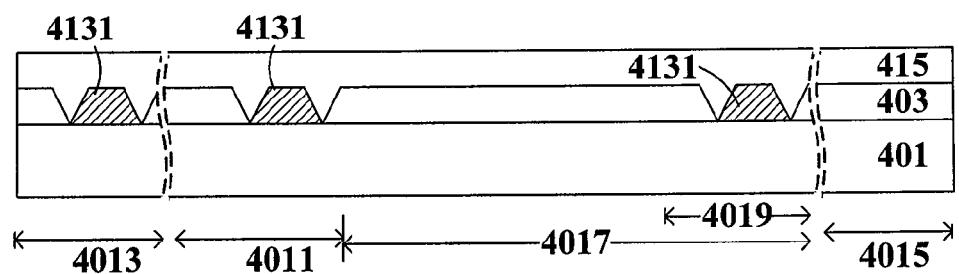
Figure 4D:
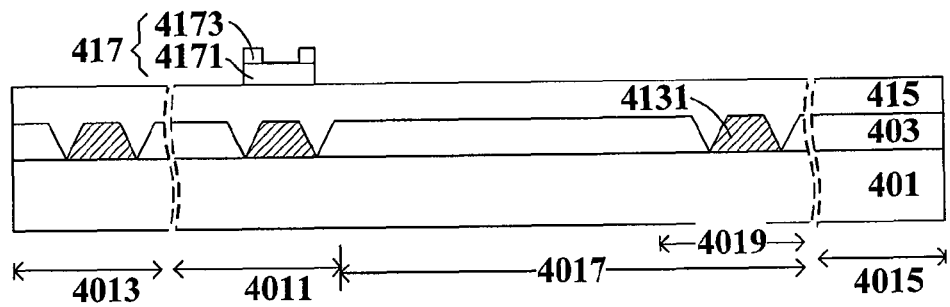

Next, as shown in FIG. 4C, an insulating layer 415 is formed on the substrate 401. Then in FIG. 4D, an active layer 417 is formed on the insulating layer 415 in the TFT region 4011, which comprises a non-doped layer 4171 and a doped layer 4173. Depending on the specific requirements, a portion of the active layer (not shown) may be formed on the insulating layer 415 in the capacitance region 4019 as a portion of the capacitance structure, and/or formed in the overlapping area between the data line region and the scanning line region. Additionally, an etching stop layer (not shown) may be formed on the active layer 417 in the TFT region 4011, and/or on the overlapping area between the data line region and the scanning line region. If formed on the active layer 417 in the TFT region 4011, the etching stop layer (not shown), preferred should be formed on the non-doped layer 4171 with the doped layer 473 partially overlapping the etching stop layer. Though the non-doped layer 4171 and the doped layer 4173 are arranged vertically in this embodiment, they are not limited to this arrangement, and may also be arranged horizontally. Furthermore, the non-doped layer 4171 may also be optionally replaced by another doped layer (not shown) with a substantially lower dopant concentration than the doped layer 4173. Furthermore, an additional doped layer (not shown) with a substantially lower dopant concentration than the doped layer 4173 may be optionally provided between the doped layer 4173 and the non-doped layer 4171.

Figure 4E:
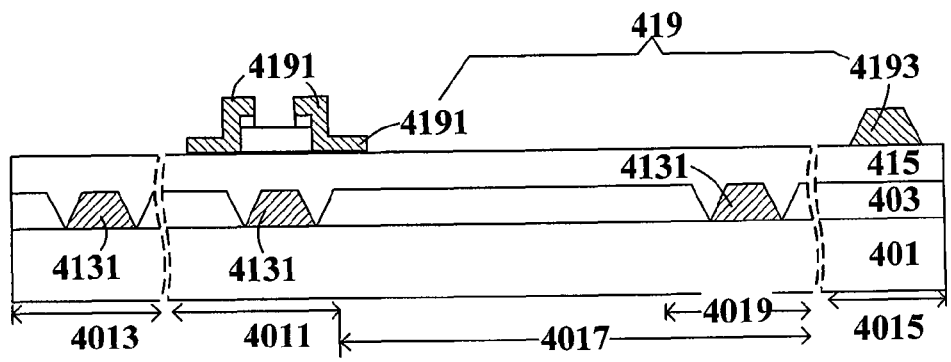

Next, in FIG. 4E, a second patterned conductor structure 419 comprising source/drain electrodes 4191 and a data line 4193 is formed on both ends of the active layer 417 and on the insulating layer 415 in the data line region 4015. Both ends of the doped layer 4173 are electrically connected to the second patterned conductor structure 419 respectively, and particularly, the source/drain electrodes 4191 are electrically connected to both ends of the doped layer 4173 respectively. Of course, depending on the specific requirements, the second patterned conductor structure 419 (not shown) may also be formed on the insulating layer 415 in the capacitance region 4019 as a portion of the capacitance structure. The second patterned conductor structure 419 comprises a metal layer, the material of which may be determined depending on the specific requirements, as described with respect to the metal layer 113 in the first embodiment.

Additionally, depending on the metal material used in the second patterned conductor structure 419 or requirements of the design or of the subsequent use, a barrier layer may be formed of a barrier material. For example, if copper is used for the metal layer of the second patterned conductor structure 419, a barrier layer (e.g. a Mo layer) may have to be formed under the metal layer. Furthermore, a second barrier layer may be formed in the second patterned conductor structure 419 if desired. The barrier material may be made from one of the materials described in the first embodiment depending on the specific requirements. Additionally, the active layer 417 and the second patterned conductor structure 419 may be formed on the insulating layer in the capacitance region. For description purposes, a structure without a barrier is depicted in FIG. 4E. Alternatively, the method described in the second embodiment, that described in the first embodiment may be optionally used to form the second patterned conductor structure 419, or general methods, which will not be described herein again.

Figure 4F:
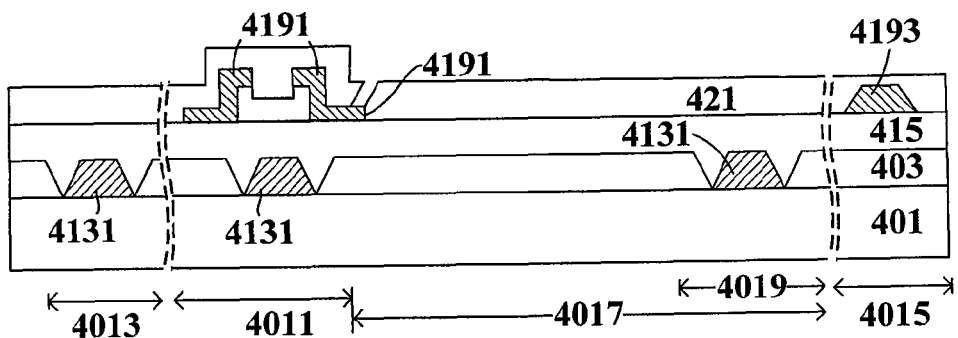
Figure 4G:
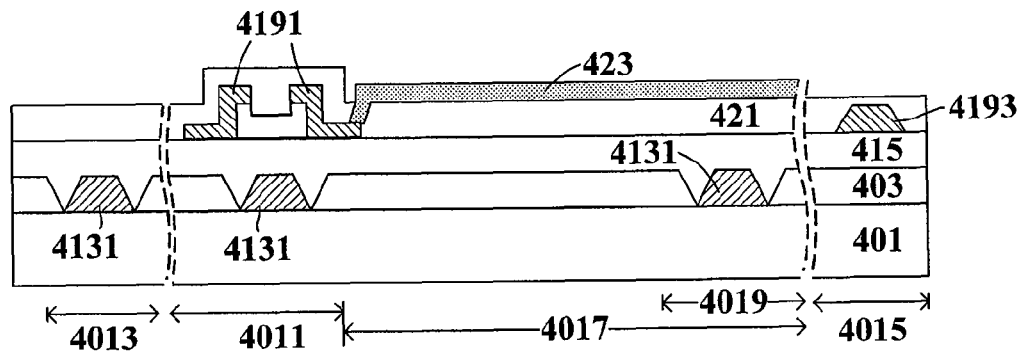
Figure 4H:
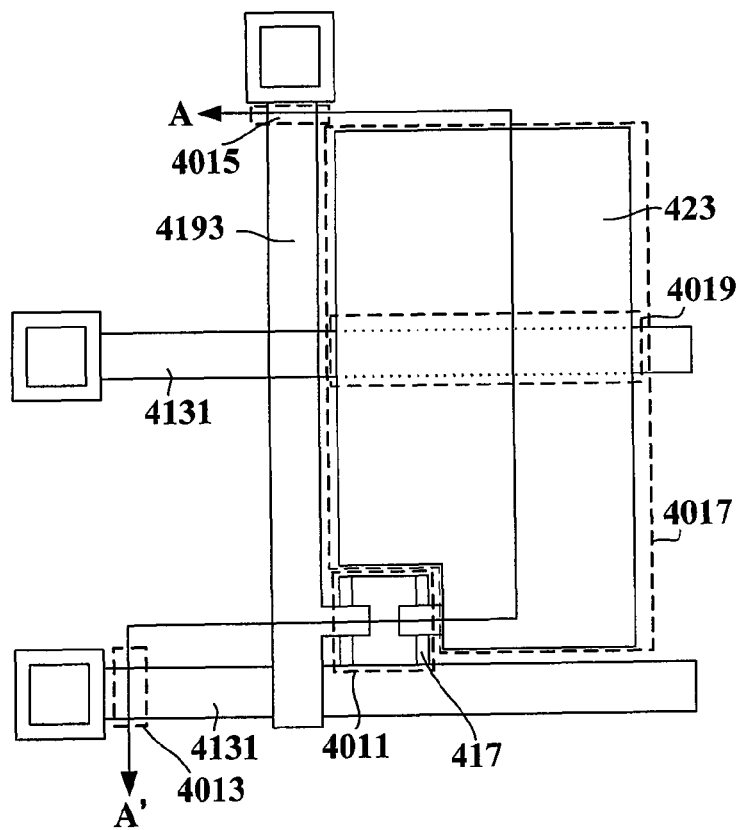

Next, as shown in FIG. 4F, a patterned protective layer 421 is formed above the substrate 401. Finally, referring to FIG. 4G, a patterned pixel electrode 423 is formed on the patterned protective layer 421 in the pixel region 4017, and is electrically connected to the second patterned conductor structure 419 at either end of the active layer 417. The method of forming a patterned pixel electrode 423 may be determined depending on requirements of the manufacturing process. For example, the method may be (1) common (i.e., a pixel electrode 423 is first formed on the patterned protective layer 421, after which a patterned organic material layer (not shown) is formed thereon, and then portions of the pixel electrode 423 not covered by the patterned organic material layer are removed), (2) the method for forming the structure in the first embodiment, (3) the method for forming the structure in the second embodiment, or (4) other suitable methods. Here, a brief description is made using the method for forming the structure in the second embodiment as an example. A patterned organic material layer (not shown) is first formed on the substrate 401, which has a third opening (not shown) exposing a portion of the patterned protective layer 421. Then, a pixel electrode 423 is formed on the portion of the patterned protective layer exposed through the third opening and on the patterned organic material layer. Finally, the patterned organic material layer and a portion of the pixel electrode thereon are removed.

Figure 5A:
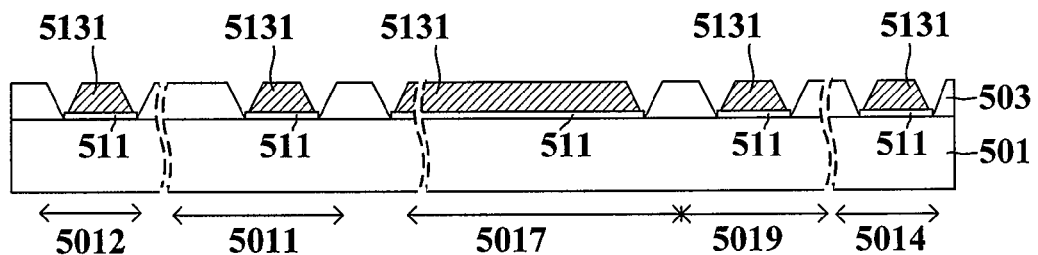
FIGS. 5A to 5D are schematic views of another method for forming a pixel structure in accordance with this invention.
Figure 5B:
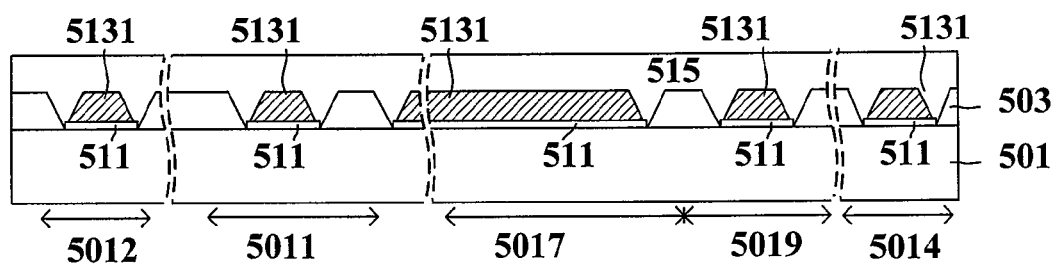
Figure 5C:
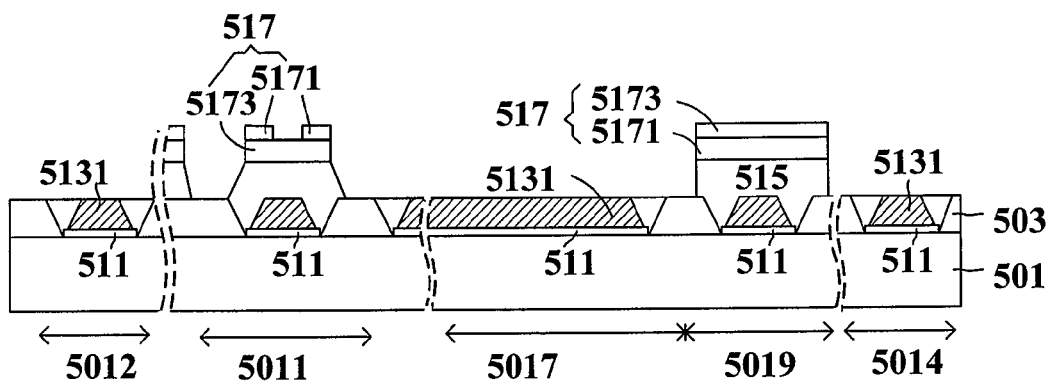
Figure 5D:
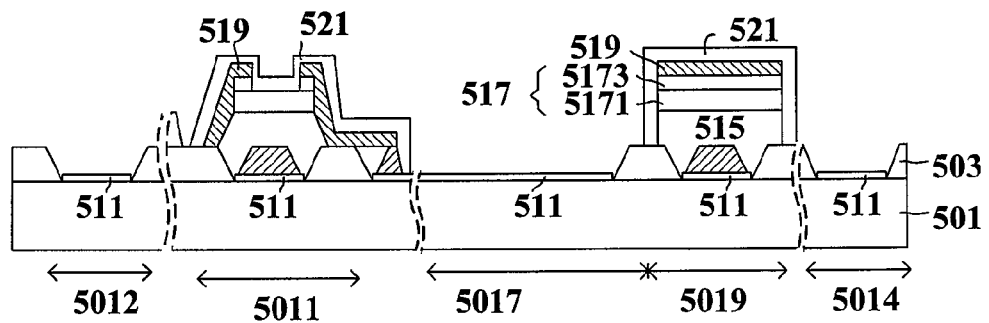
Figure 5E:
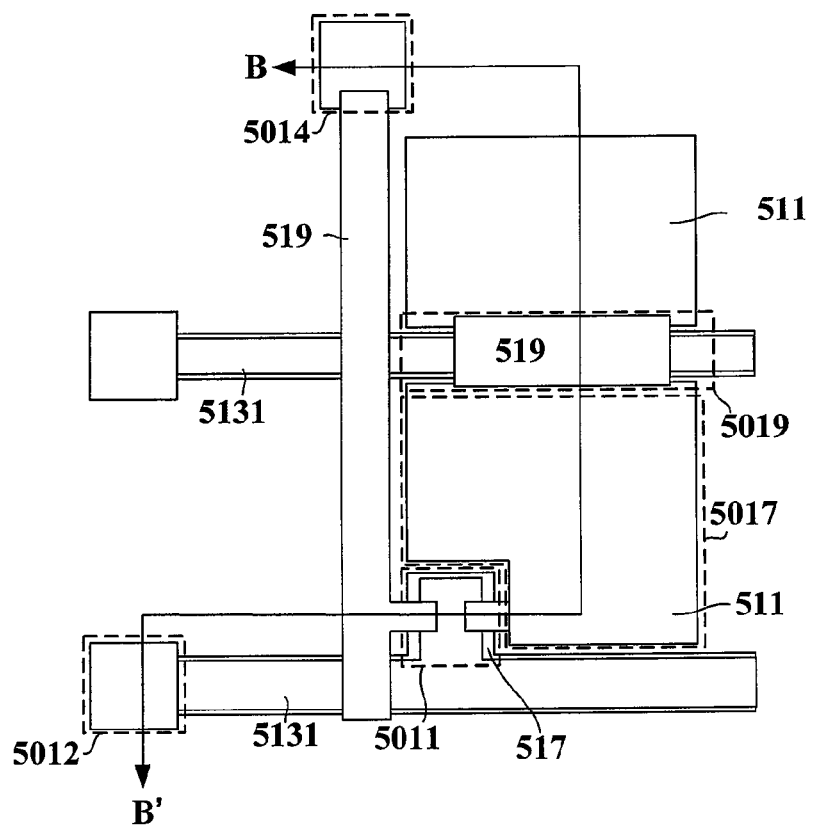

As will be appreciated by those of ordinary skill in the art, this embodiment has the following features depending on the requirements of a specific application or design. If a barrier layer is formed of a transparent conductive material under the first patterned conductor structure 4131 in the step shown in FIG. 4B, the barrier layer may be used as a pixel electrode, i.e., no other pixel electrodes need to be formed on the patterned protective layer 421. Alternately, the first patterned conductor structure 4131 may be has the barrier layer is formed of a transparent conductive material is as the pixel electrode. In respect of this, as shown in FIG. 5A, a substrate 501 is defined at least a TFT region 5011, data line region (not shown), scanning line region (not shown), pixel region 5017, and capacitance region 5019. For description purposes, the pixel region 5017 denoted in FIGS. 5A to 5E is only illustrative of a portion of the pixel region, i.e., the pixel region in this embodiment comprises locations of the transparent conductive layer 511 and the capacitance region 5019. Additionally, both the data line region and the scanning line region have a contact pad region (shown as the data line contact pad region 5014 and the scanning line contact pad region 5012) at respective ends, so that other elements (e.g. an external element not shown) may be electrically connected to the data line region and the scanning line region via the contact pad regions. A patterned dielectric layer 503 is formed on the substrate 501. In each of the regions, a transparent conductive layer 511 is formed under the first patterned conductor structure 5131. Then, as shown in FIG. 5B, an insulating layer 515 is formed on the substrate. In reference to FIG. 5C, an active layer 517 comprising a non-doped layer 5171 and a doped layer 5173 is formed on the insulating layer 515. A portion of the active layer 517 and a portion of the insulating layer 515 are removed by a lithographic and etching process to form a structure shown in FIG. 5C. Next, in reference to FIG. 5D, a second patterned conductor structure 519 is formed, after which a portion of the first patterned conductor structure 5131 and a portion of the second patterned conductor structure 519 are removed by an etching process. The etching process exposes the transparent conductive layer 511 in the pixel region 5017, the data line contact pad region 5014 and the scanning line contact pad region 5012. Finally, a patterned protective layer 521 is formed on the substrate 501 to complete the structure as shown in FIG. 5D.

Figure 6A:
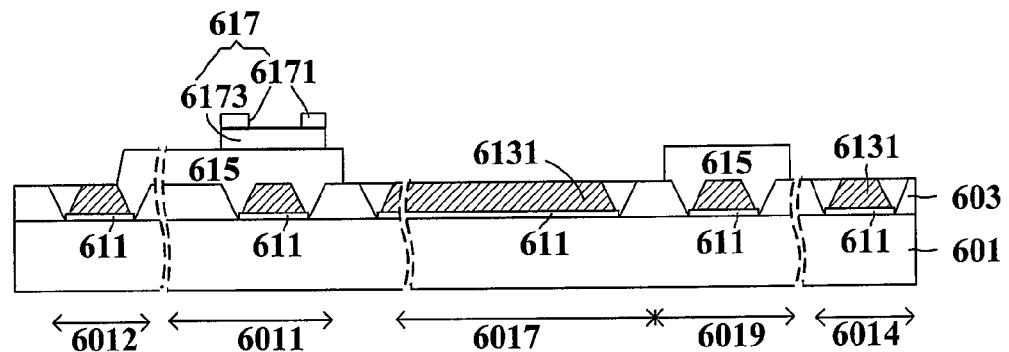
FIGS. 6A and 6B are schematic views of yet another method for forming a pixel structure in accordance with this invention.
Figure 6B:
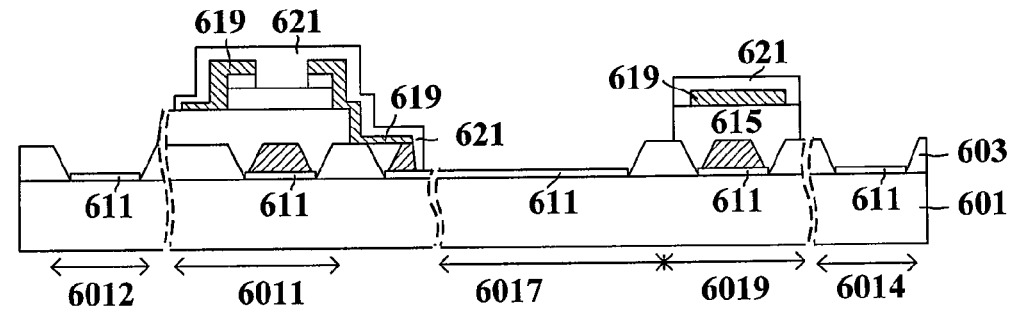
Figure 6C:
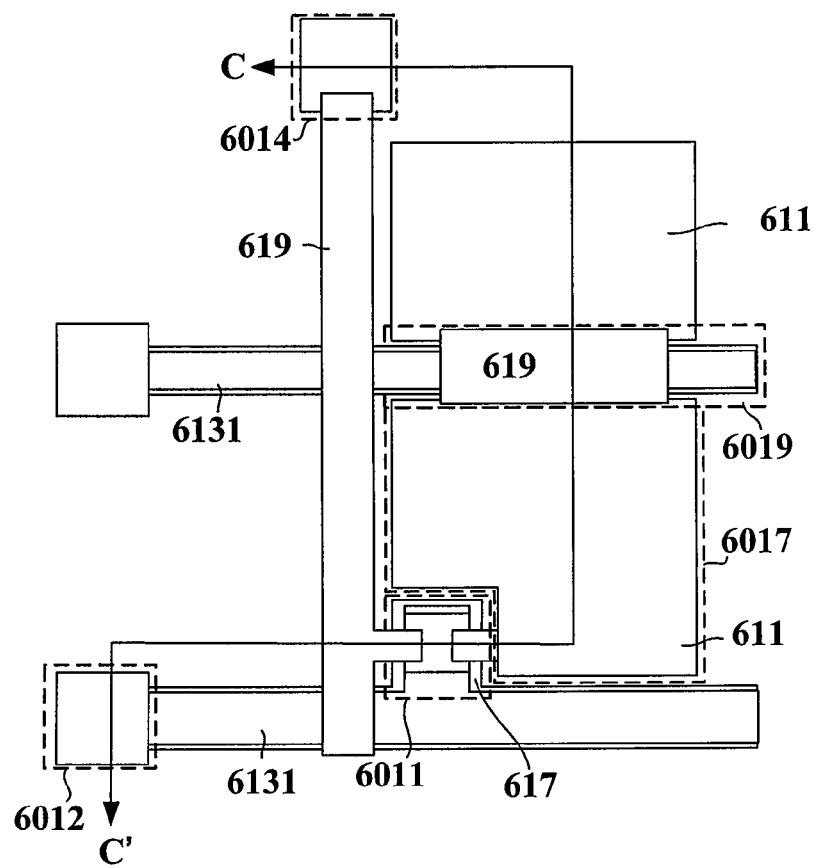

Still further, as will be appreciated by those of ordinary skill in the art, depending on the requirements of a specific application or design, this embodiment may employ in the steps subsequent to FIG. 5B a half-tone mask, a slit pattern mask, a diffraction mask, a gray level mask, or other masks that may let an organic material layer (e.g., a photoresist) with different thicknesses after exposure. In reference to FIGS. 6A to 6C, a brief description will be made on such a variation hereinafter, in which FIG. 6B is a cross-sectional view taken along line CC' in FIG. 6C. A substrate 601 is defined at least a TFT region 6011, data line region (not shown), scanning line region (not shown), pixel region 6017, and capacitance region 6019. For description purposes, the pixel region 6017 denoted in FIGS. 6A to 6E is only illustrative of a portion of the pixel region, i.e., the pixel region in this embodiment comprises locations of the transparent conductive layer 611 and the capacitance region 6019. Additionally, both the data line region and the scanning line region have a contact pad region (shown as the data line contact pad region 6014 and the scanning line contact pad region 6012) at respective ends, so that other elements (e.g. an external element not shown) may be electrically connected to the data line region and the scanning line region via the contact pad regions. As shown in FIG. 6A, upon completion of the step shown in FIG. 5B, an active layer 617 comprising a non-doped layer 6171 and a doped layer 6173 is formed on the insulating layer 615, while a portion of the active layer 617 and a portion of the insulating layer 615 are removed by a lithographic and etching process using a half-tone mask. A patterned dielectric layer 603, first patterned conductor structure 6131, transparent conductive layer 611 and insulating layer 615 are formed on the substrate 601 covering each of the preceding layers. Next, in reference to FIG. 6B, upon completion of the lithographic and etching process, a second patterned conductor structure 619 is formed on the substrate 601, after which a portion of the first patterned conductor structure 6131 and a portion of the second patterned conductor structure 619 are removed by an etching process. The etching process involves exposing a portion of the transparent conductive layer 611. Finally, a patterned protective layer 621 is formed on the substrate 601. Moreover, the organic material layer (not shown) used to remove a portion of the first patterned conductor structure 6131 and a portion of the second patterned conductor structure 619 may be optionally not removed, but reflowed by a reflowing procedure to act as the patterned protective layer 621, thus eliminating the step of forming the patterned protective layer.

Figure 7A:
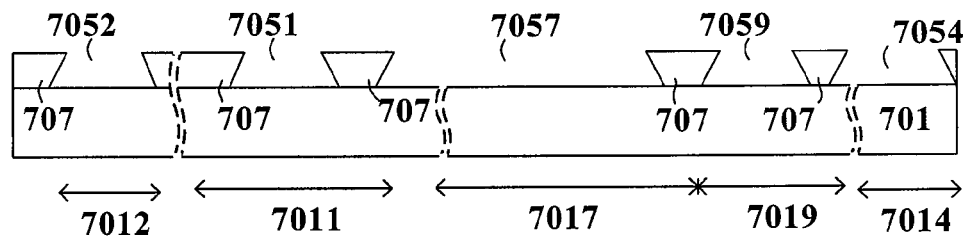
FIGS. 7A to 7D are schematic views of still a further method for forming a pixel structure in accordance with this invention.
Figure 7B:
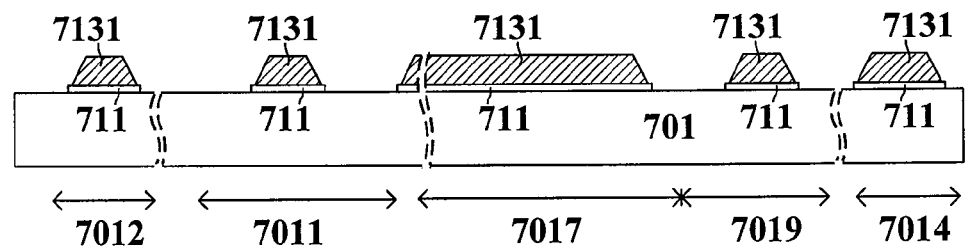
Figure 7C:
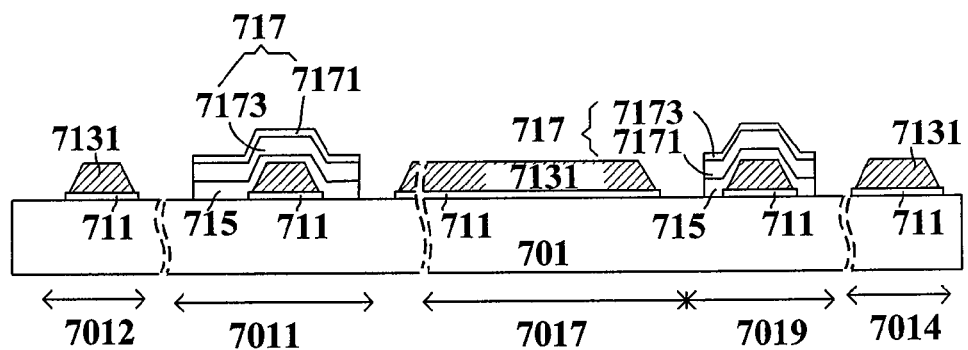
Figure 7D:
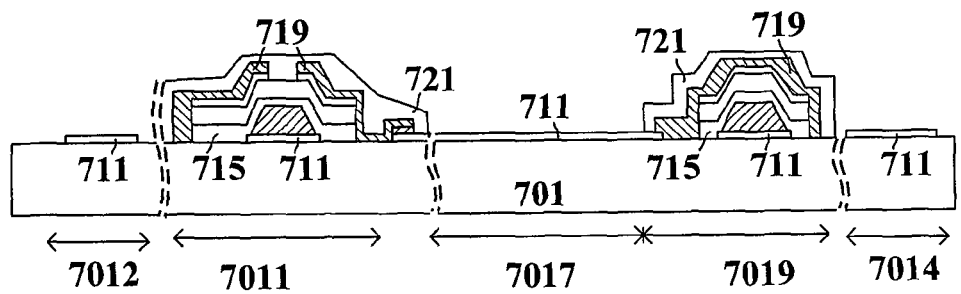
Figure 7E:
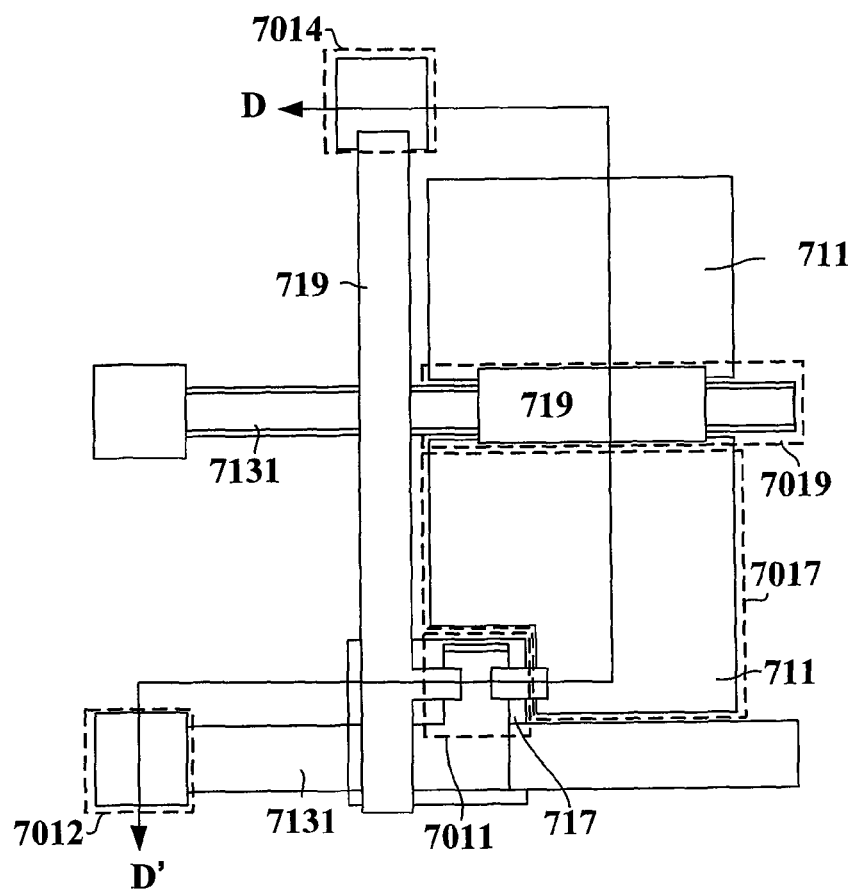

The first patterned conductor structure in this embodiment may also be formed using the aforesaid method of forming the structure of the second embodiment, which will be described briefly. FIG. 7A illustrates a substrate 701 is defined at least a TFT region 7011, a data line region (not shown), a scanning line region (not shown), a pixel region 7017, and a capacitance region 7019. For description purposes, the pixel region 7017 denoted in FIGS. 7A to 7E is only illustrative of a portion of the pixel region, i.e., the pixel region in this embodiment comprises locations of the transparent conductive layer 711 and the capacitance region 7019. Additionally, both the data line region and the scanning line region have a contact pad region (shown as the data line contact pad region 7014 and the scanning line contact pad region 7012) at respective ends, so that other elements (e.g. an external element not shown) may be electrically connected to the data line region and the scanning line region via the contact pad regions. A patterned organic material layer 707 comprising a plurality of openings 7051, 7052, 7054, 7057 and 7059 is formed on the substrate 701, which, for example, may be formed of a negative photoresist. Thereafter, a transparent conductive layer 711 and a first patterned conductor structure 7131 are formed sequentially on the substrate 701 in the openings 7051, 7052, 7054, 7057 and 7059, as well as on the organic material layer 707. Afterwards, an appropriate solvent is used to remove the organic material layer 707, as well as the transparent conductive layer 711 and the first patterned conductor layer 7131 thereon, thus obtaining a structure as shown in FIG. 7B. Next, in reference to FIG. 7C, a patterned insulating layer 715 and a patterned active layer 717 comprising a non-doped layer 7171 and a doped layer 7173 are formed sequentially on the substrate 701. Subsequently, as shown in FIG. 7D, a second patterned conductor structure 719 is formed, after which a portion of the first patterned conductor structure 7131 and a portion of the second patterned conductor structure 719 above the substrate 701 are removed by an etching process. The etching process involves exposing a portion of the transparent conductive layer 711. Finally, a patterned protective layer 721 is formed on the substrate 701 to complete a structure as shown in FIG. 7D. Moreover, the organic material layer (not shown) used to remove a portion of the first patterned conductor structure 7131 and a portion of the second patterned conductor structure 719 may be kept and reflowed using a reflowing procedure to act as the patterned protective layer 721, thus, eliminating the step of forming the patterned protective layer.

Figure 8A:
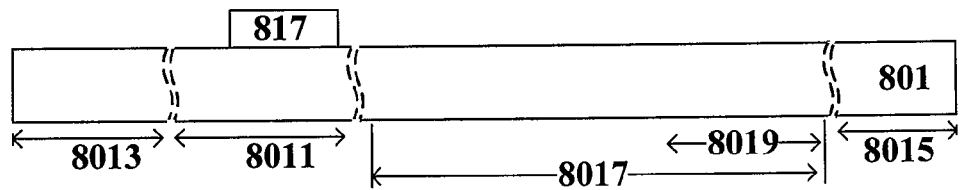
FIGS. 8A to 8F are schematic views of a method for forming another pixel structure in accordance with this invention.
Figure 8B:
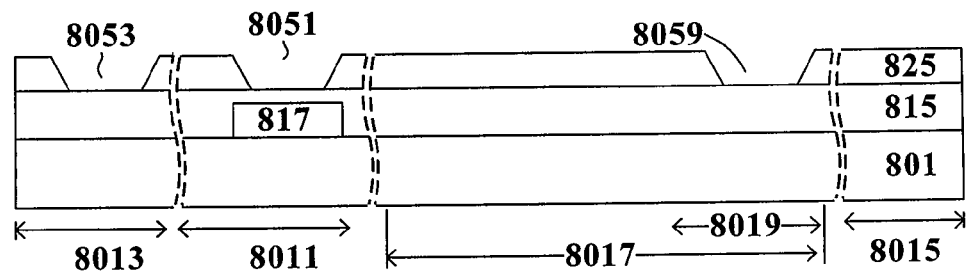

The conductor structure of this invention may further be applied to form a fourth embodiment of the pixel structure, which is described briefly. FIG. 8A illustrates, a substrate 801 defined at least a TFT region 8011, a scanning line region 8013, a data line region 8015, a pixel region 8017, and a capacitance region 8019. For description purposes, the pixel region 8017 denoted in FIGS. 8A to 8F is only illustrative of a portion of the pixel region. Then, an active layer 817 is formed, with a portion thereof formed on the substrate 801 in the TFT region 8011. Depending on the specific requirements, the substrate 801 in the capacitance region 8019 may also have a portion of the active layer (not shown) formed thereon. The active layer 817 typically comprises a highly doped region, a lightly doped region, a non-doped region, or a combination thereof. Subsequently, an insulating layer 815 is formed on the substrate 801, followed by the formation of the first patterned dielectric layer 825 on the substrate 801. The first patterned dielectric layer 825 has a plurality of first openings 8051, 8053 and 8059 defined thereon for exposing portions of the insulating layer 815 in a portion of the TFT region 8011, a portion of the scanning line region 8013, and a portion of the capacitance region 8019 respectively, as shown in FIG. 8B. Additionally, depending on the specific requirements of the manufacturing process, the deposition rate of the first patterned dielectric layer 825 may be controlled in such a way that portions of the first patterned dielectric layer 825 formed earlier have a substantially slower deposition rate than those formed later. As a result, the upper portion and the lower portion of the first patterned dielectric layer 825 will be etched at different rates and typically used to a wet etching process. In this embodiment, the upper portion and the lower portion of the first patterned dielectric layer 825 may be made of substantially the same or different materials. Alternatively, depending on the requirements of the manufacturing process, other approaches such as a dry etching process or both of the dry etching process and the wet etching process may be used instead to accomplish this goal. The active layer 817 typically comprises a highly doped region, a lightly doped region, a non-doped region, or a combination thereof, which may be optionally formed simultaneously or separately. It should be noted that the method for forming the openings to expose a portion of the substrate is preferably the method for forming the structure shown in FIGS. 2F to 2H.

Figure 8C:
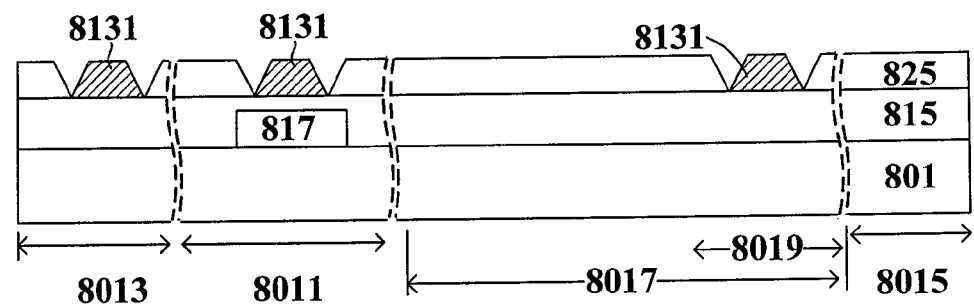

Next, in reference to FIG. 8C, a first patterned conductor structure 8131 is formed on the insulating layer 815 in the TFT region 8011, the scanning line region 8013 and the capacitance region 8019. The first patterned conductor structure 8131 comprises a metal layer, the material of which may be determined depending on the specific requirements. For example, the material may be the same as that used to form the metal layer 113 in the first embodiment. Depending on the metal material used in the first patterned conductor structure 8131 or requirements of the design, a barrier layer may be formed. For example, if copper is used for the metal layer of the first patterned conductor structure 8131, a barrier layer (e.g. a Mo layer) may have to be formed under the metal layer. The barrier material may be selected as described in the first embodiment depending on the specific requirements. For description purposes, this embodiment will be described with reference to an aspect without a barrier.

A method for forming the first patterned conductor structure 8131 may be similar to that used to form the structure of the first embodiment, which will be described in briefly. A patterned organic material layer (not shown) with a plurality of second openings (not shown) is first formed on the first patterned dielectric layer 825. The plurality of second openings correspond to some of the first openings 805 and expose a portion of the exposed portion of the substrate 801 respectively. Thereafter, a first conductor structure (not shown) is formed on the exposed portion of the substrate 801 and the patterned organic material layer. Finally, the patterned organic material layer and the first conductor structure thereon are removed to complete the structure as shown in FIG. 8C.

Another method for forming the first patterned conductor structure 8131 may be similar to that used to form the structure of the second embodiment, which will not be described again herein. Of course, depending on the requirements of the manufacturing process, other methods may also be used to form the first patterned conductor structure 8131. For description purposes, this embodiment is described with respect to the same method described just in the previous paragraph. Additionally, depending on the requirements of the manufacturing process, the deposition rate of the first patterned dielectric layer 825 may be controlled in such a way that portions of the first patterned dielectric layer 825 formed earlier have a substantially slower deposition rate than those formed later.

Figure 8D:
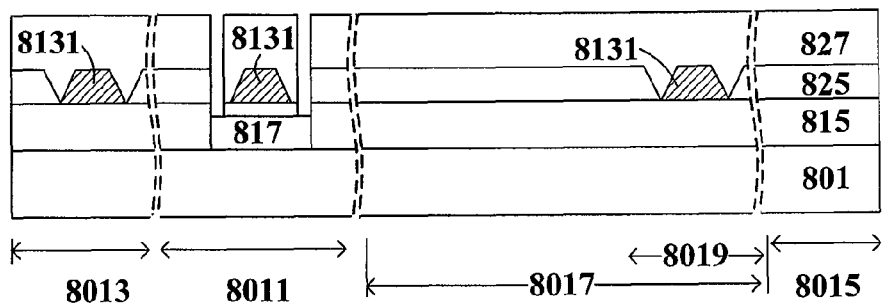
Figure 8E:
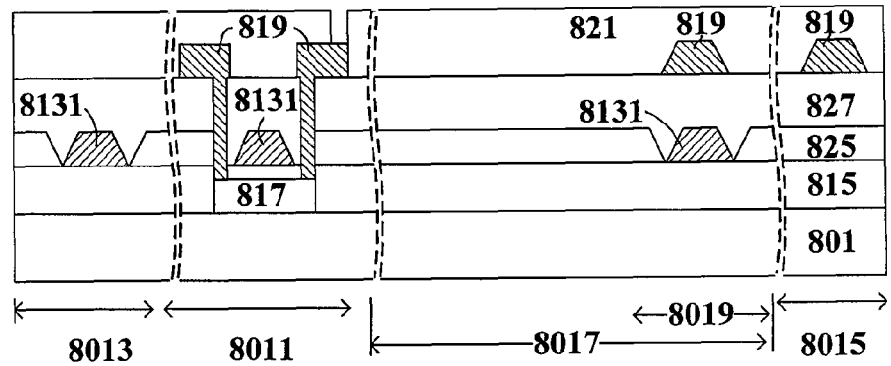

In reference to FIG. 8D, a second patterned dielectric layer 827 is formed on the substrate. Then, as shown in FIG. 8E, a second patterned conductor structure 819 is formed on the second patterned dielectric layer 827 in the data line region 8015, the capacitance region 8019 and a portion of the TFT region 8011. The second patterned conductor structure 819 in the portion of the TFT region 8011 is electrically connected to the active layer 817. Preferably, the second patterned conductor structure 819 in the capacitance region 8019 is electrically connected to the second patterned conductor structure 819 in the portion of the TFT region 8011 (such an electrical connection is not shown here), but is not limited thereto.

The second patterned conductor structure 819 comprises a metal layer, the material of which may be determined depending on the specific requirements. For example, the material may be the same as that used to form the metal layer in the first embodiment. Depending on the metal material used in the second patterned conductor structure 819 or requirements of the design, a barrier layer may be formed. For example, if copper is used for the metal layer of the second patterned conductor structure 819, a barrier layer (e.g. a Mo layer) may have to be formed under the metal layer. The barrier material may be selected as described in the first embodiment depending on the specific requirements. Thereafter, a patterned protective layer 821 is formed on the substrate 801.

Figure 8F:
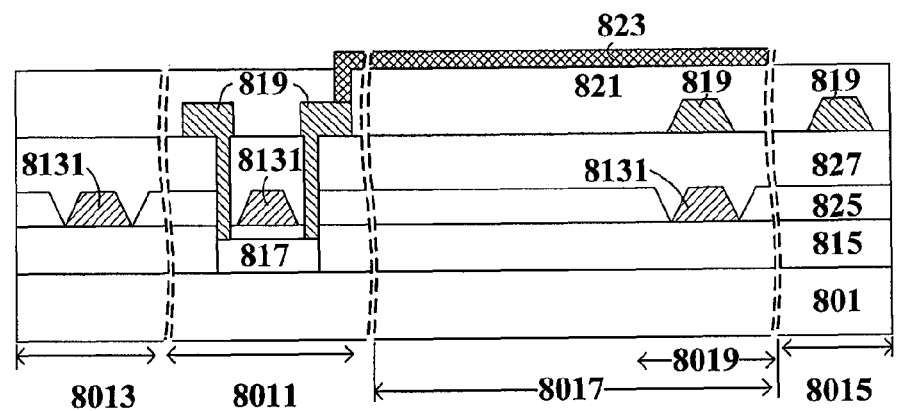

Finally, in reference to FIG. 8F, a patterned pixel electrode 823 is formed on the patterned protective layer 821 in the pixel region 8017, and is electrically connected to the second patterned conductor structure 819 in the TFT region 8011. The method for forming a patterned pixel electrode 823 may be determined depending on requirements of the manufacturing process. For example, the method may be (1) common (i.e., a pixel electrode 823 is first formed on the patterned protective layer 821, after which a patterned organic material layer (not shown) is formed thereon, and then portions of the pixel electrode 823 not covered by the patterned organic material layer are removed), (2) the method for forming the structure of the first embodiment, (3) the method for forming the structure of the second embodiment, or (4) other suitable methods. Here, a brief description is made with the method for forming the structure of the second embodiment as an example: a patterned organic material layer (not shown) is first formed on the substrate 801, which has a third opening (not shown) exposing a portion of the patterned protective layer 821. Then, a pixel electrode 823 is formed on the portion of the patterned protective layer exposed through the third opening and on the patterned organic material layer. Finally, the patterned organic material layer and a portion of the pixel electrode thereon are removed to complete the structure shown in FIG. 8F.

Figure 9A:
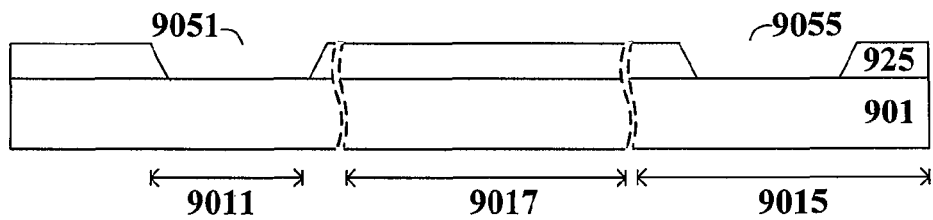
FIGS. 9A to 9D are schematic views of a method of forming yet another pixel structure in accordance with this invention.

The conductor structure of this invention may further be applied to form a fifth embodiment of the pixel structure, which will be described briefly. FIG. 9E illustrates a top view of a pixel structure formed in FIG. 9D, and FIG. 9D is a cross-sectional view taken along line EE'. FIG. 9A illustrates a substrate 901 defined at least a TFT region 9011, a data line region 9015, and a pixel region 9017. For description purposes, the pixel region 9017 denoted in FIGS. 9A to 9E is only illustrative of a portion of the pixel region, and the data line region 9015 denoted in these figures is only illustrative of a portion of the data line region. Then, the first patterned dielectric layer 925 is formed on the substrate 901. The first patterned dielectric layer 925 has a plurality of first openings defined therein, and FIG. 9A illustrates the first openings 9051 and 9055 for exposing the TFT region 9011 and the data line region 9015 respectively. Additionally, depending on the requirements of the manufacturing process, the deposition rate of the first patterned dielectric layer 925 may be controlled in such a way that portions of the first patterned dielectric layer 925 formed earlier have a substantially slower deposition rate than those formed later. As a result, the upper portion and the lower portion of the first patterned dielectric layer 925 will be etched at different rates and typically used to a wet etching process. The upper portion and the lower portion of the first patterned dielectric layer 925 may be made of the same or different materials. Alternatively, depending on the requirements of the manufacturing process, other approaches such as a dry etching process or both of the dry etching process and the wet etching process may be used instead to accomplish this goal. It should be noted that the method for forming openings to expose a portion of the substrate is preferably the method used for forming the structure shown in FIGS. 2F to 2H.

Figure 9B:
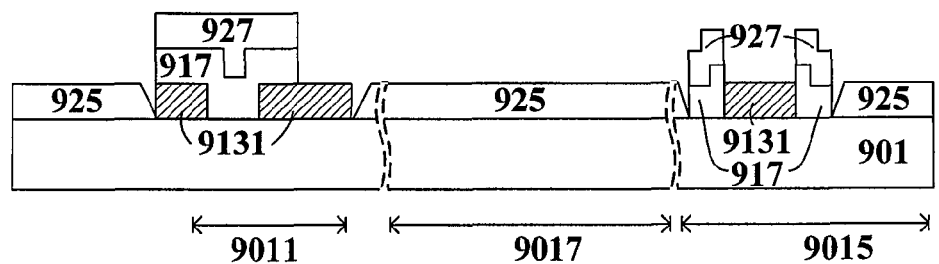

Next, as shown in FIG. 9B, a first patterned conductor structure 9131 is formed on the exposed portions of the substrate 901 through the first openings 9051, 9055 in the TFT region 9011 and the data line region 9015. The first patterned conductor structure 9131 comprises a metal layer, the material of which may be determined depending on the requirements in practical use. For example, the material may be that used to form the metal layer in the first embodiment. Depending on the material of the metal used in the first patterned conductor structure 9131 or requirements of the design, a barrier layer may be formed. For example, if copper is used for the metal layer of the first patterned conductor structure 9131, a barrier layer (e.g. a Mo layer) may have to be formed under the metal layer. The barrier material may be selected as described in the first embodiment depending on the specific requirements. For description purposes, this embodiment will be described with reference to an aspect without a barrier.

A method for forming a first patterned conductor structure 9131 may be similar to that used to form the structure of the first embodiment, which will be described briefly. A patterned organic material layer (not shown) with a plurality of second openings (not shown) is first formed on the first patterned dielectric layer 925. The plurality of second openings corresponds to the first opening 9051, 9055 and expose a portion of the exposed portion of the substrate 901 respectively. Thereafter, a first conductor structure (not shown) is formed on the exposed portion of the substrate 901 and the patterned organic material layer. Finally, the patterned organic material layer and the first conductor structure thereon are removed. Another method for forming the first patterned conductor structure 9131 may be similar to that used to form the structure of the second embodiment, which will not be described again herein. Of course, depending on requirements of the manufacturing process, other methods may also be used to form the first patterned conductor structure 9131. For description purposes, this embodiment is described with respect to an aspect utilizing the method of forming the structure of the first embodiment.

Yet another method for forming the first patterned conductor structure 9131 may be similar to that used to form the structure of the second embodiment, which will not be described again herein. Of course, depending on the requirements of the manufacturing process, other methods may also be used to form the first patterned conductor structure 9131. For description purposes, this embodiment is described with respect to an aspect using the method described just in the previous paragraph. Additionally, depending on the requirements of the manufacturing process, the deposition rate of the first patterned dielectric layer 925 may be controlled in such a way that portions of the first patterned dielectric layer 925 formed earlier have a substantially slower deposition rate than those formed later.

Next, as shown in FIG. 9B, an active layer 917 is formed, a portion of which is located on the substrate 901 in the TFT region 9011 and the data line region 9015. Depending on the specific requirements, the active layer 917 may comprise a non-doped layer and a doped layer (neither is shown). Finally, a second patterned dielectric layer 927 is formed on the substrate 901. Depending on the requirements of the manufacturing process, the deposition rate of the second patterned dielectric layer 927 may be controlled in such a way that portions of the second patterned dielectric layer 927 formed earlier have a substantially slower deposition rate than those formed later.

Figure 9C:
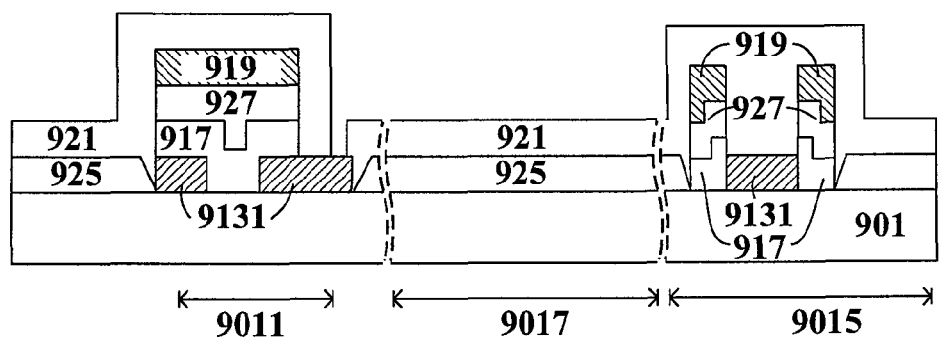
Figure 9D:
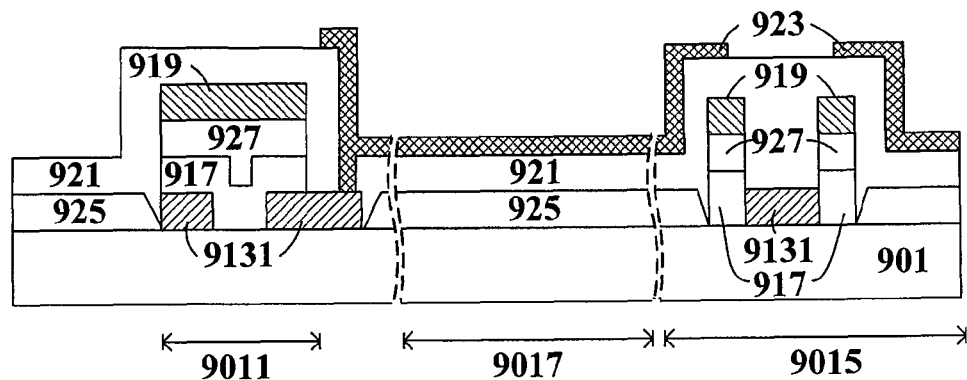
Figure 9E:
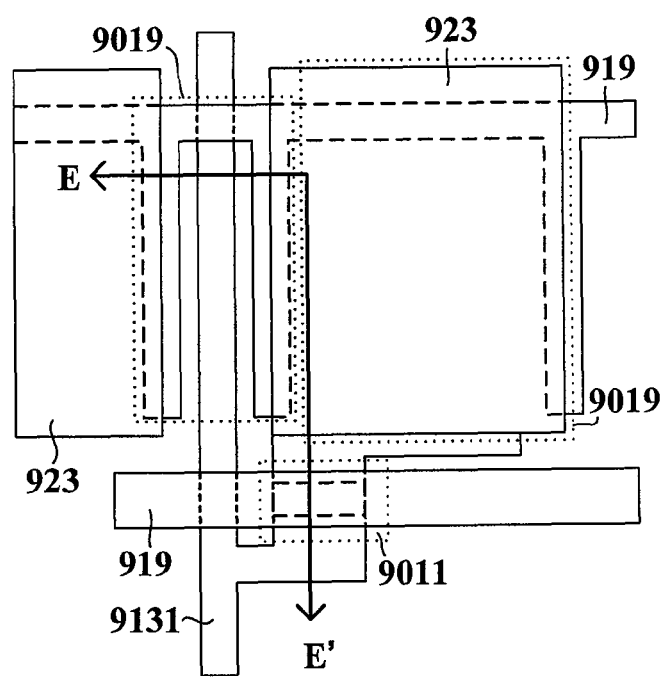

Next, as illustrated in FIG. 9C, a second patterned conductor structure 919 is formed on the second patterned dielectric layer 927 in the TFT region 9011 and a portion of the data line region 9015. A patterned protective layer 921 is then formed on the substrate 901.

Finally, in reference to FIG. 9D, a patterned pixel electrode 923 is formed on the patterned protective layer 921 in the pixel region 9017. The patterned pixel electrode 923 is electrically connected to the first patterned conductor structure 9131 in the TFT region 9011 and is extended to the patterned protective layer 921 in a portion of the data line region 9015. The method for forming a patterned pixel electrode 923 may be determined depending on the requirements of the manufacturing process. For example, the method may be (1) common (i.e., a pixel electrode 923 is first formed on the patterned protective layer 921, after which a patterned organic material layer (not shown) is formed thereon, and then portions of the pixel electrode 923 not covered by the patterned organic material layer are removed), (2) the method for forming the structure of the first embodiment, (3) the method for forming the structure of the second embodiment, or (4) other suitable methods. Here, a brief description is made with the method for forming the structure of the second embodiment as an example. A patterned organic material layer (not shown) is first formed on the substrate 901, which has a third opening (not shown) exposing a portion of the patterned protective layer 921. Then, a pixel electrode 923 is formed on the portion of the patterned protective layer exposed through the third opening and on the patterned organic material layer. Finally, the patterned organic material layer and a portion of the pixel electrode thereon are removed to complete the structure shown in FIG. 9D.

Figure 10:
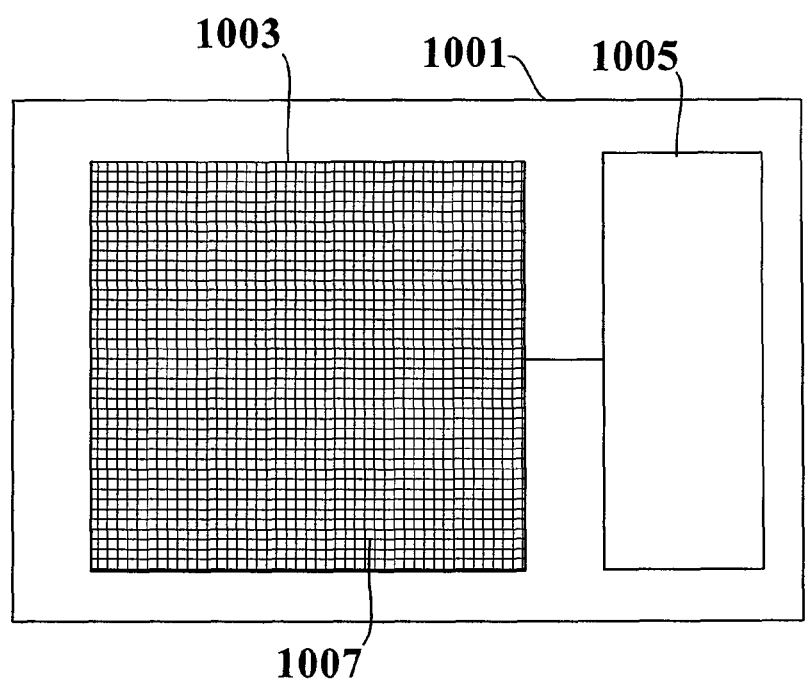
FIG. 10 is a schematic view of an electro-optical device utilizing this invention.

The conductor structure, the pixel structure and the forming methods thereof disclosed in this invention may be applied to an electro-optical device as shown in FIG. 10. The electro-opticaldevice 1001 comprises a display panel 1003, an electronic element 1007, and an electronic element 1005 electrically connected to the display panel 1003. The display panel 1003 comprises a plurality of pixels 1007. The electronic device 1005 may be a control device, an operating device, a processing device, an input device, a memory device, a driving device, a light emitting device, a protective device, a sensing device, a detecting device, or other functional devices, or a combination thereof. The photoelectric device 1001 may be a portable product (e.g., a handset, a video camera, a camera, a notebook type computer, a game console, a watch, a music player, an electronic photograph, an email transceiver, a map navigator, or a similar product), a video/audio product (e.g., a video/audio player or a similar product), a display screen, a TV set, an indoor or outdoor visual panel, a panel in a projector, and etc. Additionally, the display panel 1003 may comprise an LCD panel (e.g., a transmissive type, a transflective type, a reflective type, a double-sided type, a vertical alignment type (VA), an in-plane switching type (IPS), a multi-domain vertical alignment type (MVA), a twisted nematic (TN) type, a super twisted nematic (STN) type, a pattern vertical alignment (PVA) type, a super pattern vertical alignment (S-PVA) type, an advanced super view (ASV) type, a fringe field switching (FFS) type, a continuous pinwheel alignment (CPA) type, an axial symmetric microcell (ASM) type, an optical compensation bend (OCB) type, a super in-plane switching (S-IPS) type, an advanced super in-plane switching (AS-IPS) type, an ultra fringe field switching (UFFS) type, a polymer stable alignment (PSA) type, a dual-view type, a triple-view type, or other types, or a combination thereof), or an organic electroluminescent display panel, depending on the display medium (e.g., a LC layer, an organic light-emitting layer (e.g., monomers, polymers, or a combination thereof), or a combination thereof) electrically contacting at least one of the pixel electrodes and the drain electrodes in the display panel.

Furthermore, at least one of the first patterned conductor structures, second patterned conductor structures and patterned pixel electrodes described in the above embodiments may be formed optionally using the method of the first embodiment or the second embodiment of this invention, depending on the requirements of the design (e.g., to reduce the number of masks, to reduce the cost, or other considerations). For example, if an additional patterned dielectric layer is needed in the method for forming at least one of the first patterned conductor structure, the second patterned conductor structure, and the patterned pixel electrode, the forming method for the first embodiment and its variations may be used. Alternatively, if no additional patterned dielectric layer is needed in the forming method of at least one of the first patterned conductor structure, the second patterned conductor structure and the patterned pixel electrode, the forming method of the second embodiment may be used. Moreover, at least one of the first patterned conductor structure, the second patterned conductor structure and the patterned pixel electrode may be applied to various TFTs comprising a pixel structure.

In summary, by virtue of the lift-off process, this invention is able to form a conductor structure, and particularly, a pixel structure. The ability to effectively form metal conductors (particularly copper conductors) endows this invention with a high industrial applicability. The above disclosure is related to the detailed technical contents and inventive features thereof. People skilled in this field may proceed with a variety of modifications and replacements based on the disclosures and suggestions of the invention as described without departing from the characteristics thereof. For example, the patterned pixel electrodes in this invention may also be disposed under the conductor structure or used to replace the barrier layer. Further, lithographic procedures using masks of different transparency may also be employed in the method of this invention to reduce the number of processing steps, wherein the lithographic procedures using masks of different transparency may be applied in individual layers of the pixel structure, such as the active layer and the second patterned conductor structure, the active layer and the insulating layer, the active layer and the etching stop layer or the like. Nevertheless, although such modifications and replacements are not fully disclosed in the above descriptions, they have substantially been covered in the following claims as appended.

What is claimed is:

1. A method of forming a pixel structure, comprising:
    forming a patterned dielectric layer on a substrate comprising a thin film transistor region, a scanning line region, a data line region, a pixel region and a capacitance region in which the patterned dielectric layer has a plurality of openings adapted to individually expose portions of the substrate in the thin film transistor region, in the scanning line region and in the capacitance region;
    forming a first patterned conductor structure on the exposed substrate in the thin film transistor region, the scanning line region and the capacitance region;
    forming an insulating layer above the substrate;
    forming an active layer on the insulating layer in the thin film transistor region;
    forming a second patterned conductor structure on the two ends of the active layer and on the insulating layer in the data line region; and
    forming a patterned protective layer above the substrate.

2. The method of claim 1, further comprising forming a patterned pixel electrode on the patterned protective layer in the pixel region, in which the patterned pixel electrode electrically connects to the second patterned conductor structure formed on one end of the active layer.

3. The method of claim 2, wherein the formation of the patterned pixel electrode comprising:
    forming a patterned organic material layer above the substrate, in which the patterned organic material layer has a third opening for exposing a portion of the patterned protective layer;
    forming a pixel electrode on portions of the exposed patterned protective layer and on the exposed patterned organic material layer; and
    removing the pixel electrode on the patterned organic material layer.

4. The method of claim 1, wherein the active layer includes a non-doped layer and a doped layer, and the two ends of the doped layer are individually connect to the second patterned conductor structure.

5. The method of claim 4, further comprising forming an etching stop layer on the active layer.

6. The method of claim 1, wherein at least one of the first patterned conductor structure and the second patterned conductor structure comprises a barrier layer and a metal layer.

7. The method of claim 6, further comprising forming the second patterned conductor structure on the insulating layer in the capacitance region.

8. The method of claim 6, wherein the insulating layer in the capacitance region comprises the active layer and the second patterned conductor structure.

9. The method of claim 6, further comprising forming the first patterned conductor structure with a barrier layer in a portion of the pixel region above the substrate.

10. The method of claim 1, wherein at least one of the first patterned conductor structure and the second patterned conductor structure comprises a first barrier layer, a metal layer and a second barrier layer.

11. The method of claim 1, further comprising forming another patterned dielectric layer on a portion of the insulating layer which has a plurality of other openings for exposing two ends of the active layer.

12. The method of claim 1, wherein the formation of the first patterned conductor structure comprising:
    forming a patterned organic material layer on the patterned dielectric layer, in which the patterned organic material layer defines a plurality of second openings corresponding to a portion of the openings and exposing the exposed substrate;
    forming a first conductor structure on the exposed portion of the substrate and on the patterned organic material layer; and
    removing the patterned organic material layer and the first conductor structure thereon.

13. The method of claim 1, wherein the formation of a first patterned conductor structure comprising:
    forming a first patterned conductor structure on a portion of the exposed substrate and on the patterned dielectric layer; and
    removing the patterned dielectric layer and the first patterned conductor structure thereon.

14. A method of forming a display panel comprising the method of claim 1.

15. A method of forming an electro-optical device comprising the method of claim 14.

16. A method of forming a pixel structure, comprising:
    providing a substrate with a thin film transistor region, a scanning line region, a data line region, a pixel region and a capacitance region;
    forming an active layer, wherein a portion of the active layer is formed on the substrate in the thin film transistor region;
    forming an insulating layer on the substrate;
    forming a first patterned dielectric layer above the substrate, in which the first pattern dielectric layer defines a plurality of openings adapted to individually expose the insulating layer in portions of the thin film transistor region, the scanning line region and the capacitance region;
    forming a first patterned conductor structure on the exposed insulating layer in the thin film transistor region, the scanning line region, and the capacitance region;
    forming a second patterned dielectric layer above the substrate;
    forming a second patterned conductor structure on the second patterned dielectric layer in the data line region, on the second patterned dielectric layer in a portion of the thin film transistor region and connecting to the active layer, and on the second patterned dielectric layer in the capacitance region;
    forming a patterned protective layer above the substrate; and
    forming a patterned pixel electrode on the patterned protective layer in the pixel region, in which the patterned pixel electrode connects to the second patterned conductor structure in the thin film transistor region.

17. The method of claim 16, further comprising forming the active layer above the substrate in the capacitance region.

18. The method of claim 16, wherein the material of at least one of the first patterned conductor structure and of the second patterned conductor structure comprises a barrier layer, a metal layer or the combinations of the foregoing.

19. The method of claim 16, wherein a portion of the active layer in the thin film transistor region comprises a highly doped region, a lightly doped region or the combinations of the foregoing.

20. The method of claim 16, wherein a deposition rate of the earlier formed portion of the first patterned dielectric layer or second patterned dielectric layer is substantially smaller than a deposition rate of the later formed portion of the first patterned dielectric layer or second patterned dielectric layer.

21. The method of claim 16, wherein the formation of the first patterned conductor structure, comprising:
- forming a patterned organic material layer on the first patterned dielectric layer, in which the patterned organic material layer defines a second opening corresponding to a portion of the first opening and exposing the exposed substrate;
- forming a first conductor structure on a portion of the exposed insulating layer and on the patterned organic material layer; and
- removing the patterned organic material layer and the first conductor structure thereon.

22. The method of claim 16, wherein the formation of the first patterned conductor structure, comprising:
- forming the first patterned conductor structure on a portion of the exposed insulating layer and on the patterned dielectric layer; and
- removing the patterned dielectric layer and the first patterned conductor structure thereon.

23. The method of claim 16, wherein the formation of the patterned pixel electrode, comprising:
- forming a patterned organic material layer above the substrate, in which the patterned organic material layer has a third opening exposing a portion of the patterned protective layer;
- forming a pixel electrode on a portion of the exposed patterned protective layer and on the patterned organic material layer; and
- removing the pixel electrode on the patterned organic material layer.

24. A method of forming a display panel comprising the method of claim 16.

25. A method of forming an electro-optical device comprising the method of claim 24.

26. A method of forming a pixel structure, comprising:
- providing a substrate with at least one thin film transistor region, a data line region and a pixel region;
- forming a first patterned dielectric layer on the substrate, in which the first patterned dielectric layer defines a plurality of first openings adapted to individually expose portions of the thin film transistor region and the data line region;
- forming a first patterned conductor structure on the exposed substrate in the thin film transistor region, and on the exposed substrate in the data line region;
- forming an active layer, wherein portions of the active layer are formed above the substrate in the thin film transistor region and in the data line region;
- forming a second patterned dielectric layer above the substrate;
- forming a second patterned conductor structure on the second patterned dielectric layer in the thin film transistor region and in a portion of the data line region;
- forming a patterned protective layer above the substrate; and
- forming a patterned pixel electrode on the patterned protective layer in the pixel region, the patterned pixel electrode connecting to the first patterned conductor structure in the thin film transistor region and extending to a portion of the patterned protective layer in the data line region.

27. The method of claim 26, wherein the material of at least one of the first patterned conductor structure and of the second patterned conductor structure comprises a barrier layer, a metal layer, or combinations of thereof.

28. The method of claim 26, wherein a deposition rate of the earlier formed portion of the first patterned dielectric layer or second patterned dielectric layer is substantially smaller than a deposition rate of the later formed portion of the first patterned dielectric layer or second patterned dielectric layer.

29. The method of claim 26, wherein the active layer comprises a non-doped layer and at least one doped layer.

30. The method of claim 26, wherein the formation of the first patterned conductor structure, comprises:
- forming a patterned organic material layer on the first patterned dielectric layer, in which the patterned organic material layer defines a second opening corresponding to a portion of the first opening and exposing a portion of exposed the substrate;
- forming a first conductor structure on the exposed portion of the substrate and on the patterned organic material layer; and
- removing the patterned organic material layer and the first conductor structure thereon.

31. The method of claim 26, wherein the formation of the first patterned conductor structure, comprises:
- forming a first conductor structure on a portion of the exposed substrate and on the patterned dielectric layer; and
- removing the patterned dielectric layer and the first conductor structure thereon.

32. The method of claim 26, wherein the formation of the patterned pixel electrode, comprises:
- forming a patterned organic material layer above the substrate with a third opening, in which the third opening exposes a portion of the patterned protective layer;
- forming a pixel electrode on a portion of the exposed patterned protective layer and on the patterned organic material layer; and
- removing the pixel electrode on the patterned organic layer.

33. A method of forming a display panel comprising the method of claim 26.

34. A method of forming an electro-optical device comprising the method of claim 33.

* * * * *